(12) United States Patent
Song et al.

(10) Patent No.: US 11,943,946 B2
(45) Date of Patent: Mar. 26, 2024

(54) WHITE ORGANIC LIGHT EMITTING ELEMENT AND DISPLAY DEVICE USING THE SAME

(71) Applicant: LG Display Co., Ltd., Seoul (KR)

(72) Inventors: Wook Song, Seoul (KR); Eun-Jung Park, Goyang-si (KR); Chun-Ki Kim, Seoul (KR); Se-Ung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 102 days.

(21) Appl. No.: 17/102,049

(22) Filed: Nov. 23, 2020

(65) Prior Publication Data

US 2021/0175456 A1    Jun. 10, 2021

(30) Foreign Application Priority Data

Dec. 6, 2019 (KR) .................. 10-2019-0161896

(51) Int. Cl.
*H10K 50/13* (2023.01)
*H10K 50/11* (2023.01)
(Continued)

(52) U.S. Cl.
CPC ........... *H10K 50/131* (2023.02); *H10K 50/11* (2023.02); *H10K 50/15* (2023.02); *H10K 50/19* (2023.02);
(Continued)

(58) Field of Classification Search
CPC ............... H01L 27/322; H01L 51/5004; H01L 51/5016; H01L 51/5056; H01L 51/5278; H01L 27/3244; H01L 51/0067; H01L 51/0085; H01L 2251/5376; H01L 2251/5384; H01L 2251/552; H01L 27/3213; H01L 51/5028; H01L 51/5024; H01L 27/32; H01L 51/5048; H01L 2251/30; H01L 51/50–56; H01L 51/0032–0095; H01L 2251/50–568; H01L 51/504–5044; B32B 2457/206; H10K 50/131; H10K 50/11; H10K 50/15;
(Continued)

(56) References Cited

U.S. PATENT DOCUMENTS 7,683,536 B2   3/2010 Forrest et al.
8,558,224 B2   10/2013 Sawabe et al.
(Continued)

FOREIGN PATENT DOCUMENTS

CN    101156257 A    4/2008
CN    102694127 A    9/2012
(Continued)

OTHER PUBLICATIONS

China National Intellectual Property Administration, Office Action, Chinese Patent Application No. 202011293104.8, dated Sep. 14, 2023, 20 pages.
(Continued)

*Primary Examiner* — Mohammad A Rahman
(74) *Attorney, Agent, or Firm* — Fenwick & West LLP

(57) ABSTRACT

Disclosed are a white organic light emitting element, which may uniformize the color coordinates of white regardless of a change in current density by changing the configuration of different kinds of light emitting layers contacting each other, and a display device using the same.

20 Claims, 18 Drawing Sheets

(51) Int. Cl.
*H10K 50/15* (2023.01)
*H10K 50/19* (2023.01)
*H10K 59/12* (2023.01)
*H10K 59/38* (2023.01)
*H10K 85/30* (2023.01)
*H10K 85/60* (2023.01)
*H10K 101/00* (2023.01)
*H10K 101/10* (2023.01)
*H10K 101/30* (2023.01)
*H10K 101/40* (2023.01)

(52) U.S. Cl.
CPC ............ *H10K 59/38* (2023.02); *H10K 59/12* (2023.02); *H10K 85/342* (2023.02); *H10K 85/654* (2023.02); *H10K 2101/10* (2023.02); *H10K 2101/27* (2023.02); *H10K 2101/30* (2023.02); *H10K 2101/40* (2023.02); *H10K 2101/90* (2023.02)

(58) Field of Classification Search
CPC ........ H10K 50/19; H10K 59/38; H10K 59/12; H10K 85/342; H10K 85/654; H10K 2101/10; H10K 2101/27; H10K 2101/30; H10K 2101/40; H10K 2101/90; H10K 50/121; H10K 59/351; H10K 50/13; H10K 50/12; H10K 50/14; H10K 2102/00
See application file for complete search history.

(56) References Cited

U.S. PATENT DOCUMENTS

| | | |
|---|---|---|
| 9,281,489 B2 | 3/2016 | Sakuma et al. |
| 10,446,612 B2 | 10/2019 | Zhang |
| 10,547,020 B2 | 1/2020 | Jang et al. |
| 10,707,436 B2 | 7/2020 | You et al. |
| 11,217,757 B2 | 1/2022 | Adamovich et al. |
| 2006/0279204 A1 | 12/2006 | Forrest et al. |
| 2011/0240965 A1* | 10/2011 | Yoon .................. H01L 27/3211 257/E51.026 |
| 2012/0007070 A1* | 1/2012 | Kai .................... H10K 85/6572 257/40 |
| 2012/0241725 A1* | 9/2012 | Sawabe ............... H10K 50/11 257/40 |
| 2013/0221337 A1 | 8/2013 | Sakuma et al. |
| 2017/0077434 A1* | 3/2017 | Kim .................... H10K 50/16 |
| 2017/0125487 A1* | 5/2017 | Song ................. H10K 50/125 |
| 2018/0033994 A1 | 2/2018 | Jang et al. |
| 2018/0061901 A1 | 3/2018 | Zhang |
| 2018/0138249 A1 | 5/2018 | Song et al. |
| 2019/0006608 A1* | 1/2019 | Koo ................... H10K 50/131 |
| 2019/0100543 A1* | 4/2019 | Yen ................... H10K 85/6572 |
| 2019/0181369 A1* | 6/2019 | You .................... H10K 50/13 |
| 2019/0280213 A1 | 9/2019 | Adamovich et al. |
| 2020/0106040 A1* | 4/2020 | Yamamoto ............. H10K 50/11 |
| 2021/0343943 A1* | 11/2021 | Ohsawa ............... H10K 85/615 |

FOREIGN PATENT DOCUMENTS

| | | |
|---|---|---|
| CN | 102959039 A | 3/2013 |
| CN | 106972111 A | 7/2017 |
| CN | 109216570 A | 1/2019 |
| CN | 110021705 A | 7/2019 |
| KR | 10-0495594 B1 | 6/2005 |
| KR | 10-2014-0059713 A | 5/2014 |
| KR | 10-1680934 B1 | 11/2016 |
| KR | 10-2018-0013536 A | 2/2018 |
| KR | 10-2019-0107602 A | 9/2019 |

OTHER PUBLICATIONS

Korean Intellectual Property Administration, Office Action, KR Patent Application No. 10-2019-0161896, dated Jan. 2, 2024, 12 pages.

* cited by examiner

WHITE ORGANIC LIGHT EMITTING ELEMENT AND DISPLAY DEVICE USING THE SAME

CROSS-REFERENCE TO RELATED APPLICATIONS

This application claims the benefit of Republic of Korea Patent Application No. 10-2019-0161896, filed on Dec. 6, 2019, which is hereby incorporated by reference as if fully set forth herein.

BACKGROUND

Field

The present disclosure relates to a light emitting element, and more particularly, to a white organic light emitting element, which may uniformize the color coordinates of white regardless of a change in current density by changing the configuration of different kinds of light emitting layers contacting each other, and a display device using the same.

Discussion of the Related Art

As society has recently entered the information age, the field of displays for visually displaying electrical information signals has rapidly developed and, in order to satisfy such development, various flat display devices having excellent performance, such as slimness, light-weight and low power consumption, have been developed and have rapidly replaced conventional cathode ray tubes (CRTs).

As examples of such display devices, there are a liquid crystal display (LCD) device, a plasma display panel (PDP) device, a field emission display (FED) device, an organic light emitting diode (OLED) display device, a quantum dot display device, etc.

Thereamong, an organic light emitting diode (OLED) display device, which does not require a separate light source and achieves compactness and clear color display, is considered as a competitive application.

Such as organic light emitting diode (OLED) display device includes a plurality of subpixels, and an organic light emitting element provided in each of the subpixels, thus emitting light without a separate light source.

Recently, a tandem element, in which an organic layer and a light emitting layer are provided in common in addition to the configuration of an organic light emitting element without a deposition mask, is receiving attention due to ease of processing thereof, and thus research thereon is underway.

However, in the tandem element including a plurality of light emitting layers, particularly, in a stack including different kinds of light emitting layers, the light emitting layers in the stack influence each other and cause a change in an emission zone within the light emitting layers, thereby making it difficult to implement a uniform white color and thus causing poor image quality.

SUMMARY

Accordingly, the present disclosure is directed to a white organic light emitting element and a display device using the same that substantially obviate one or more problems due to limitations and disadvantages of the related art.

An object of the present disclosure is to provide a white organic light emitting element, which may uniformize the color coordinates of white regardless of a change in current density by changing the configuration of different kinds of light emitting layers contacting each other, and a display device using the same.

Another object of the present disclosure is to provide a white organic light emitting element, which adjusts the compositions of hosts and dopants in different kinds of light emitting layers of a phosphorescent light emitting stack of a multi-stack structure are adjusted so as to generate an emission zone at the interface between the different kinds of light emitting layer, and may thus express uniform color coordinates of white.

Additional advantages, objects, and features of the disclosure will be set forth in part in the description which follows and in part will become apparent to those having ordinary skill in the art upon examination of the following or may be learned from practice of the disclosure. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a white organic light emitting element includes a first electrode and a second electrode arranged opposite each other, and at least one blue light emitting stack and a phosphorescent light emitting stack, provided between the first electrode and the second electrode and separated from each other by a charge generation layer, wherein the phosphorescent light emitting stack includes a hole transport layer, a red light emitting layer, a green light emitting layer and an electron transport layer, wherein the red light emitting layer includes a red dopant having a HOMO energy level lower than or equal to a HOMO energy level of the hole transport layer, and red hosts.

The red hosts may include electron transporting hosts. The red hosts may include only electron transporting hosts.

In another aspect of the present disclosure, a display device includes a substrate including a thin film transistor provided in each of a plurality of subpixels, a first electrode connected to the thin film transistor in each subpixel, and a second electrode spaced apart from the first electrode and provided throughout the subpixels, and at least one blue light emitting stack and a phosphorescent light emitting stack, provided between the first electrode and the second electrode and separated from each other by a charge generation layer, wherein the phosphorescent light emitting stack includes a hole transport layer, a red light emitting layer, a green light emitting layer and an electron transport layer, wherein the red light emitting layer includes a red dopant having a HOMO energy level lower than or equal to a HOMO energy level of the hole transport layer, and red hosts.

It is to be understood that both the foregoing general description and the following detailed description of the present invention are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the invention.

DETAILED DESCRIPTION

Figure 1:
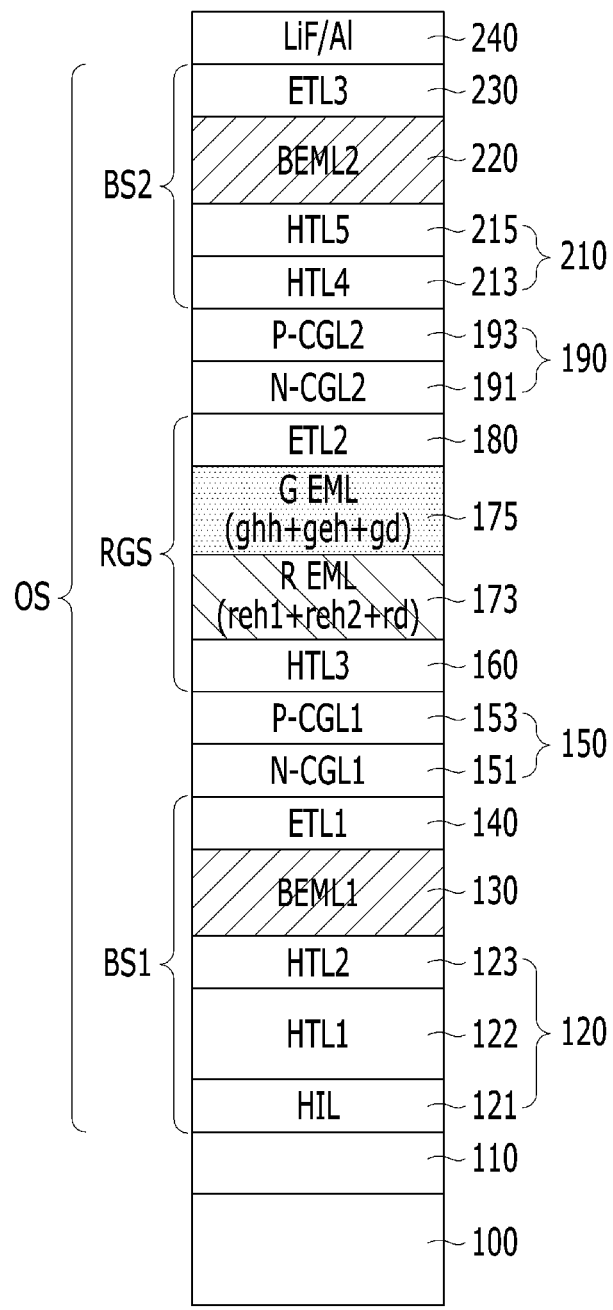
FIG. 1 is a cross-sectional view illustrating a white organic light emitting element according to a first embodiment of the present disclosure.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease of preparation of the specification, and may thus differ from the names of parts of an actual product.

Shapes, sizes, rates, angles and numbers disclosed in the drawings to describe the embodiments of the present invention are only exemplary and do not limit the present invention. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of characteristics, numbers, steps, operations, elements, parts or combinations thereof, or the possibility of adding the same, unless the term "only" is used. It will be understood that a singular expression encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is "on", "above", "under" or "beside" another element, the two elements may directly contact each other, or one or more other elements may be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to discriminate the same or similar elements. Therefore, a first element described hereinafter may be a second element without departing from the technical scope of the invention.

Respective features of the various embodiments of the present invention may be partially or wholly coupled to or combined with each other and be technically variously interlocked or driven, and the respective embodiments may be implemented independently of each other or be implemented together through connection therebetween.

In the following description of the embodiments, the "Lowest Unoccupied Molecular Orbital (LUMO) energy level" and the "Highest Occupied Molecular Orbital (HOMO) energy level" of a layer means a LUMO energy level and a HOMO energy level of a material occupying the majority of the weight of the corresponding layer, for example, a host material, unless they refer to the LUMO energy level and the HOMO energy level of a dopant material with which the corresponding layer is doped.

In the following description of the embodiments, it will be understood that "the HOMO energy level" means an energy level measured through cyclic voltammetry (CV) in which an energy level is determined from a potential value relative to that of a reference electrode having a known electrode potential value. For example, the HOMO energy level of any material may be measured using ferrocene having a known oxidation potential value and reduction potential value, as a reference electrode.

In the following description of the embodiments, the term "doped" means that the content of a material having properties different from a material occupying the majority of the weight of a corresponding layer (for example, materials having different properties being N-type and P-type materials or an organic material and an inorganic material), which is added to the material occupying the majority of the weight of the corresponding layer, is less than 20 wt %. In other words, a "doped" layer means a layer in which a host material and a dopant material may be discriminated from each other based on a ratio of the weight percents thereof. In addition, the term "undoped" means all cases other than the case corresponding to the term "doped". For example, if a layer is formed of a single material or is formed of a mixture of materials having the same or similar properties, the layer may be an "undoped" layer. For example, if at least one of materials forming a layer is P-type and none of the materials forming the layer are N-type, the layer is an "undoped" layer. For example, if at least one of materials forming a layer is an organic material and none of of the materials forming the layer are inorganic materials, the layer is an "undoped" layer. For example, if all of the materials forming a layer are organic materials and at least one of the materials forming the layer is N-type and at least another of the other materials is P-type, when the content of the N-type material is less than 20 wt % or the content of the P-type material is less than 20 wt %, the layer is a "doped" layer.

In the following description of the embodiments, an electroluminescence (EL) spectrum is calculated by multiplying (1) a photoluminescence (PL) spectrum, in which the intrinsic properties of a light emitting material, such as a dopant material or a host material included in an organic light emitting layer, are reflected, by (2) an out-coupling emittance spectrum curve which is determined by the structure and optical properties of an organic light emitting element including the thickness of organic layers, such as an electron transport layer.

Figure 2:
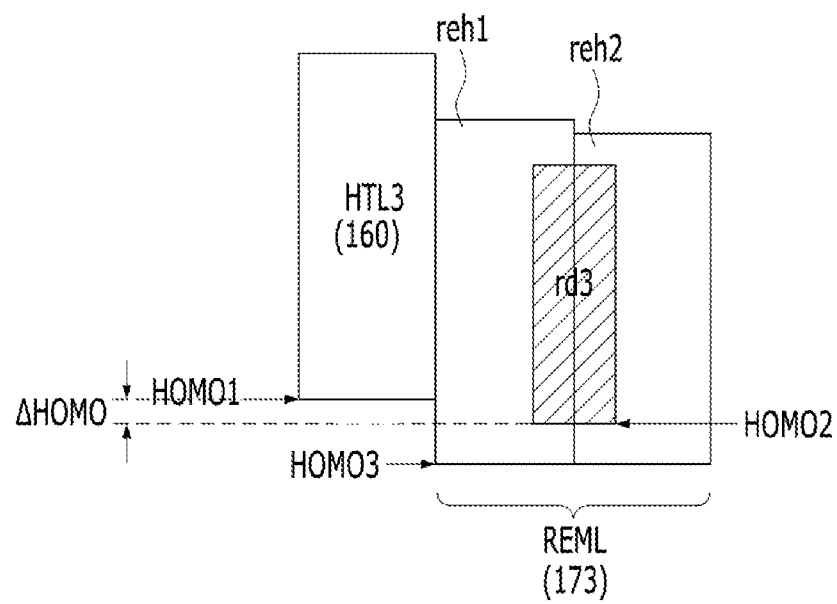
FIG. 2 is an energy band diagram between a hole transport layer and a red light emitting layer of a phosphorescent light emitting stack of FIG. 1 according to an embodiment of the present disclosure.

FIG. 1 is a cross-sectional view illustrating a white organic light emitting element according to a first embodiment of the present disclosure, and FIG. 2 is an energy band diagram between a hole transport layer and a red light emitting layer of a phosphorescent light emitting stack of FIG. 1 according to an embodiment of the present disclosure.

As shown in FIG. 1, the white organic light emitting element according to the first embodiment of the present disclosure includes a first electrode 110 and a second electrode 240 arranged opposite each other on a substrate 100, and an organic stack OS provided between the first electrode 110 and the second electrode 240.

The organic stack OS includes a plurality of light emitting stacks BS1, RGS, and BS2, and charge generation layers 150 and 190 provided between the light emitting stacks BS1, RGS, and BS2.

Respective layers in the organic stack OS in the present disclosure may be layers including organic components as main components, and may further include inorganic matter, such as metal, as necessary so as to improve transfer of carriers or luminescence.

Further, light emitted from respective light emitting layers of the light emitting stacks BS1, RGS, and BS2 provided in the organic stack OS is combined and emitted towards any one of the first electrode 110 and/or the second electrode 240, thus expressing white. When the first electrode 110 is a reflective electrode and the second electrode 240 is a transparent electrode, light is emitted towards the second electrode 240, and when the first electrode 110 is a transparent electrode and the second electrode 240 is a reflective electrode, light is emitted towards the first electrode 110. As circumstances require, when both the first and second electrodes 110 and 240 are transparent electrodes, light may be emitted in both directions.

Although FIG. 1 illustrates that a first blue light emitting stack BS1, a phosphorescent light emitting stack RGS, and a second blue light emitting stack BS2 are sequentially stacked in a direction from the first electrode 110 to the second electrode 240, the order thereof may be changed. Further, in order to express white, only two stacks, i.e., a blue light emitting stack and a phosphorescent light emitting stack, may be provided between the first and second electrodes 110 and 240, or as circumstances require, four or more light emitting stacks may be provided. By varying the number of light emitting stacks depending on a required color temperature, color coordinate values may be changed to correspond to the color temperature for expressing a white color of the white organic light emitting element to be implemented. When the light emitting stacks are under constant conditions, the color temperature may be raised as the number of the light emitting stacks is increased.

When three or more light emitting stacks are provided between the first and second electrodes 110 and 240, two or more blue light emitting stacks BS may be provided.

The blue light emitting stacks BS1 and BS2 have emission peaks at wavelengths of 440 nm to 480 nm, and the phosphorescent light emitting stack RGS has an emission peak at longer wavelengths than those of the blue light emitting stacks BS1 and BS2 and, for example, may include different kinds of light emitting layers having emission peaks at different green wavelengths and red wavelengths. The green wavelengths may have an emission peak at wavelengths of 500 nm to 540 nm and thus be emitted as pure green light, or have an emission peak at wavelengths of 540 nm to 580 nm and thus be emitted as yellowish green light, depending on the luminescence property of a green dopant. Further, the red wavelengths have an emission peak at wavelengths of 600 nm to 640 nm.

Therefore, blue light emitted from the blue light emitting stacks BS1 and BS2 and green and red light emitted from the phosphorescent light emitting stack RGS are combined and emitted towards any one of the first electrode 110 and/or the second electrode 240, thus implementing white light.

The light emitting stacks BS1, RGS, and BS2 include hole transport units 120, 160, and 210, light emitting layers 130, 173/175, and 220, and electron transport units 140, 180, and 230, respectively.

In FIG. 1, the hole transport unit 120 of the first blue light emitting stack BS1 includes a hole injection layer 121, a first hole transport layer 122, and a second hole transport layer 123.

The hole injection layer 121 is a layer of the organic stack OS which directly contacts the first electrode 110 formed of inorganic matter, which is a component of a transparent electrode or a reflective electrode, and lowers interfacial stress and an energy barrier when holes are injected from an interface with the first electrode 110, so that the holes are smoothly injected into the organic stack OS. When the layer contacting the first electrode 110 belongs to another light emitting stack, for example, a phosphorescent light emitting stack RGS, the phosphorescent light emitting stack RGS may include a hole injection layer. Here, the first electrode 110 functions as an anode.

The reason why the hole transport unit 120 of the first blue light emitting stack BS1 includes the first and second hole transport layers 122 and 123 is to form a first optimal distance of blue light from the first electrode 110, i.e., to generate resonance in which reflection and re-reflection are optimally repeated within the distance between the first electrode 110 and the second electrode 240, and the configuration of these first and second hole transport layers 122 and 123 may be changed by the position of a reflective electrode selected from the first electrode 110 and the second electrode 240 and the thickness of a transparent electrode selected from the first electrode 110 and the second electrode 240. In the hole transport unit 120, the thicknesses of the first and second hole transport layers 122 and 123 may be changed, or any one of the first and second hole transport layers 122 and 123 may be omitted.

Further, the first blue light emitting stack BS1 includes a first blue light emitting layer 130 and a first electron transport layer 140 on the hole transport unit 120.

The first blue light emitting layer 130, which is a light emitting layer provided on the first blue light emitting stack BS1, includes a host and a blue dopant which emits light by receiving energy through excitons generated in the host. The blue dopant may be a phosphorescent dopant or a fluorescent dopant, or include both thereof. In the following test examples, when the color coordinates of white were determined, the first and second blue light emitting layers 130 and 220 of the first and second blue light emitting stacks BS1 and BS2, each of which includes a fluorescent blue dopant, were tested. However, the reason for this is that it was confirmed that, among blue dopants which have been developed, fluorescent blue dopants have a lifespan and efficiency of a designated level or more, and any phosphorescent blue dopant may be substituted for fluorescent blue dopant as long as the phosphorescent blue dopant has the same or similar lifespan and efficiency as the fluorescent blue dopant. In the white organic light emitting element of the present disclosure, the reason why the blue light emitting stacks BS1 and BS2 are provided separately from the phosphorescent light emitting stack RGS which emits light of longer wavelengths than blue light is to sufficiently implement blue light when a display device requires uniform color expression because the visual recognition efficiency of blue light is lower than those of other colors of light.

The phosphorescent light emitting stack RGS located on the first blue light emitting stack BS1 includes different kinds of light emitting layers. The phosphorescent light emitting stack RGS includes a third hole transport layer 160, a red light emitting layer 173, a green light emitting layer 175, and a second electron transport layer 180.

In the phosphorescent light emitting stack RGS, the red light emitting layer 173 and the green light emitting layer 175 contact each other, the red light emitting layer 173 contacts the third hole transport layer 160, and the green light emitting layer 175 contacts the second electron transport layer 180. Each of the red light emitting layer 173 and the green light emitting layer 175 is a phosphorescent light emitting layer, and in order to maximize efficiency of excitons used to emit red and green light in the phosphorescent light emitting stack RGS, the excitons and carrier, such as holes and electrons, may be concentrated at the interface between the red light emitting layer 173 and the green light emitting layer 175 without biasing the carriers or the excitons (including singlet and triplet excitons) towards the first electrode 110 or the second electrode 240.

For this purpose, the white organic light emitting element of the present disclosure suggests the configuration of the red light emitting layer 173 and the green light emitting layer 175, and the red light emitting layer 173 includes, as shown in FIG. 2, a red dopant rd3 having a HOMO energy level HOMO2 lower than or equal to the HOMO energy level HOMO1 of the adjacent third hole transport layer 160.

Further, the red dopant r3 has the low HOMO energy level HOMO2 and thus serves as electron acceptor and aids in a function of transporting electrons, and may be, for example, a compound of thienopyrimidine and a heavy metal, such as iridium or the like. However, the compound of thienopyrimidine and the heavy metal is only exemplary, and may be substituted with any dopant material which emits red light, has a HOMO energy level lower than the HOMO energy level HOMO1 of the adjacent third hole transport layer 160 shown in FIG. 2, and performs a function of smoothly transferring electrons to the inside of a light emitting layer without trapping the electrons.

If the HOMO energy level HOMO2 of the red dopant rd3 is equal to or lower than the HOMO energy level HOMO1 of the third hole transport layer 160, transport of holes from the third hole transport layer 160 to the red light emitting layer 173 may be carried out normally without trapping the electrons, and thus, the holes may be transferred to the interface between the red light emitting layer 173 and the green light emitting layer 175 (in FIG. 5) without accumulation of electrons at the interface between the third hole transport layer 160 and the red light emitting layer 173, and concentration of excitons at the interface in the red light emitting layer 173 and the green light emitting layer 175 may be reinforced. Thereby, the excitons may be used to effectively emit light from the red light emitting layer 173 and the green light emitting layer 175, and thus efficiency may be improved. Further, in the organic light emitting element of the present disclosure, trapping of holes in a low-current condition (at a low grayscale) is solved because the HOMO energy level HOMO2 of the red dopant rd3 is lower than the HOMO energy level HOMO1 of the third hole transport layer 160, excitons are concentrated at the same position or a similar position both at the low grayscale and the high grayscale, and thus, a change in the color coordinates of white, occurring due to a color property variation according to a current condition, may be prevented.

Further, when there is a difference ΔHOMO between the HOMO energy level HOMO1 of the third hole transport layer 160 and the HOMO energy level HOMO2 of the red dopant rd3, the difference ΔHOMO may be 0.01 eV to 0.5 eV so as to reduce an interfacial barrier and acquire a stabilized material of the red dopant rd3.

In addition, equality between the HOMO energy level HOMO1 of the third hole transport layer 160 and the HOMO energy level HOMO2 of the red dopant rd3 may mean not only that the HOMO energy level HOMO1 of the third hole transport layer 160 and the HOMO energy level HOMO2 of the red dopant rd3 are numerically completely equal to each other, but also that different materials of the third hole transport layer 160 and the red dopant rd3 meet and influence each other at the interface therebetween and thus fluctuates within about ±0.2 eV from the intrinsic HOMO energy levels thereof.

The red light emitting layer 173 includes electron transporting hosts reh1 and reh2 as hosts in addition to the red dopant rd3. Here, the red light emitting layer 173 prevents trapping of holes, is involved in the function of transporting electrons and thus does not require any separate hole transporting host, and may perform a function of transferring carriers including the holes and the electrons in the different kinds of light emitting layers 173 and 175 using only the electron transporting hosts reh1 and reh2. As circumstances require, the red light emitting layer 173 may include a small amount of a hole transporting host.

Further, the HOMO energy level HOMO2 of the red dopant rd3 may be higher that the HOMO energy levels HOMO3 of the electron transporting hosts reh1 and reh2, such that the red dopant rd3 functions to aid in transport of holes.

That is, the organic light emitting element of the present disclosure includes the phosphorescent light emitting stack RGS including the different kinds of light emitting layers 173 and 175, in which the red light emitting layer 173 contacting the third hole transport layer 160 includes the red dopant rd3 having the HOMO energy level HOMO2 lower than or equal to the HOMO energy level HOMO1 of the hole transport layer 160, thereby allowing carriers, particularly, holes from the third hole transport layer 160 adjacent to the red light emitting layer 173 to be smoothly transported to the interface between the red light emitting layer 173 and the green light emitting layer 175, without trapping the carriers by the red dopant rd3 in the area of the red light emitting layer 173 adjacent to the hole transport layer 160.

Further, the red light emitting layer 173 of the phosphorescent light emitting stack RGS includes only the electron transporting hosts reh1 and reh2, and one of the electron transporting hosts reh1 and reh2 may be the same as an electron transporting host in the green light emitting layer 175. Consequently, a common material, i.e., the electron transporting host reh1 or reh2, is distributed in both the red light emitting layer 173 and the green light emitting layer 175 of the phosphorescent light emitting stack RGS, and holes supplied from the third hole transport layer 160 are not stagnant in the red light emitting layer 173 but maintain a constant transfer rate. Particularly, in order to prevent an emission zone from being changed due to holes being pushed to the rear end of the heterogeneous light emitting layer configuration, i.e., a part thereof far away from the first electrode 110, at the low grayscale (at the low current density) due to a difference in electric field dependencies between holes and electrons, when the red light emitting layer 173 includes only the electron transporting hosts reh1 and reh2, the emission zone may be maintained at the interface between the red light emitting layer 173 and the green light emitting layer 175. Therefore, even when a display device has a difference between the low grayscale and the high grayscale or displays the low grayscale or the high grayscale at different times, the display device may secure uniformity in the color coordinates of white and thus facilitate stable display.

The second blue light emitting stack BS2 includes the hole transport unit 210, formed by stacking fourth and fifth hole transport layers 213 and 215, the second blue light emitting layer 220, and a third electron transport layer 230.

In FIG. 1, the second electrode 240 may include inorganic compound components, i.e., LiF and Al, LiF may function as an electron injection layer, and Al may function as the second electrode 240, i.e., a cathode.

The electron injection layer is formed of a compound of alkali metal or alkali earth metal and a halogen element, and LiF may be substituted with any of various other materials. Alternatively, the electron injection layer may be omitted as circumstances require.

Further, Al used to form the second electrode 240 is only exemplary, and may be substituted with any of various other metals into which electrons are easily injected. In some cases, the second electrode 240 may be formed by stacking a plurality of metal layers, only one of these metal layer may be formed of a reflective metal and the remainder may be formed of transparent metals, and in this case, the second electrode 240 may be formed by stacking a reflective metal layer and transparent metal layers.

The charge generation layers 150 and 190 may be respectively formed by stacking n-type charge generation layers 151 and 191 contacting lower light emitting stacks adjacent thereto and p-type charge generation layers 153 and 193 contacting upper light emitting stacks adjacent thereto, as shown in these figures. However, this is only exemplary, and charge generation layers, in which electrons and holes are generated by doping one or more hosts with an n-type dopant and a p-type dopant, and are then supplied to adjacent stacks, may be provided.

Although, in the embodiment shown in FIG. 1, the first and second blue light emitting stacks BS1 and BS2 are located on the upper and lower surfaces of the phosphorescent light emitting stack RGS, the first and second blue light emitting stacks BS1 and BS2 are limited thereto, and the positions thereof may be changed as circumstances require.

Figure 3A:
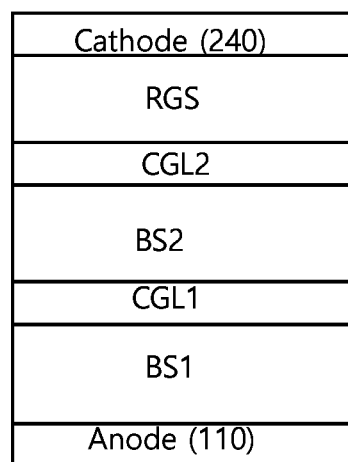
FIGS. 3A and 3B are schematic cross-sectional views illustrating white organic light emitting elements according to other embodiments of the present disclosure.
Figure 3B:
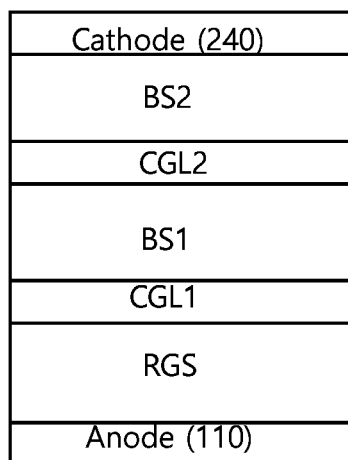

FIGS. 3A and 3B are schematic cross-sectional views illustrating white organic light emitting elements according to other embodiments of the present disclosure.

FIG. 3A illustrates a white organic light emitting element according to a second embodiment, and the white organic light emitting element includes a first blue light emitting stack BS1, a second blue light emitting stack BS2 and a phosphorescent light emitting stack RGS, which are sequentially arranged between a first electrode 110 and a second electrode 240.

In this case, the phosphorescent light emitting stack RGS includes different kinds of light emitting layers, i.e., the red light emitting layer 173 and the green light emitting layer 175, as shown in FIG. 1, and may thus concentrate light emission at the interface between the red light emitting layer 173 and the green light emitting layer 175 regardless of current density and exhibit the uniform color coordinates of white.

The above-described charge generation layers may be provided between the light emitting stacks BS1, BS2, and RGS.

Further, a white organic light emitting element according to a third embodiment of the present disclosure, as shown in FIG. 3B, includes a phosphorescent light emitting stack RGS, a first blue light emitting stack BS1, and a second blue light emitting stack BS2, which are sequentially arranged between a first electrode 110 and a second electrode 240.

In the white organic light emitting element according to the third embodiment, the phosphorescent light emitting stack RGS also includes different kinds of light emitting layers, i.e., the red light emitting layer 173 and the green light emitting layer 175, as shown in FIG. 1, and may thus concentrate light emission at the interface between the red light emitting layer 173 and the green light emitting layer 175 regardless of current density and exhibit uniform the color coordinates of white.

The above-described charge generation layers may be provided between the light emitting stacks RGS, BS1, and BS2.

In the white organic light emitting elements according to the second and third embodiments, the position of the light emitting layer in each light emitting stack may be set to a position where optimal resonance of the wavelength of light emitted by the light emitting layer occurs, and when the blue light emitting layers and other colored light emitting layers are located in the stacks arranged in an order different from the order shown in FIG. 1 between the first and second electrodes 110 and 240, the distances between the respective light emitting layers and the first electrode 110 may be adjusted by changing the thickness of the adjacent charge generation layer 150 or 190 or the thicknesses of the hole transport units 120 and 210.

Although FIGS. 1, 3A, and 3B illustrate that the triple light emitting stack structure is provided between the first electrode 110 and the second electrode 240, other blue light emitting stacks and/or other phosphorescent light emitting stacks may be further added in order to further improve luminous efficacy.

Hereinafter, the functions and effects of the white organic light emitting element according to the present disclosure will be verified through various tests.

In test examples other than third test examples, the triple light emitting stack structure shown in FIG. 1 was used, and elements other than the red light emitting layer and the green light emitting layer of the phosphorescent light emitting stack had the same structure.

Figure 4A:
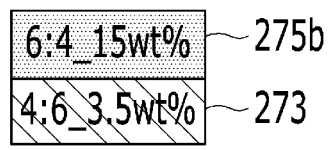
FIGS. 4A and 4B are a cross-sectional view illustrating a heterogeneous light emitting layer configuration according to a first test example and an energy band diagram between a hole transport layer and a red light emitting layer therein, respectively.
Figure 4B:
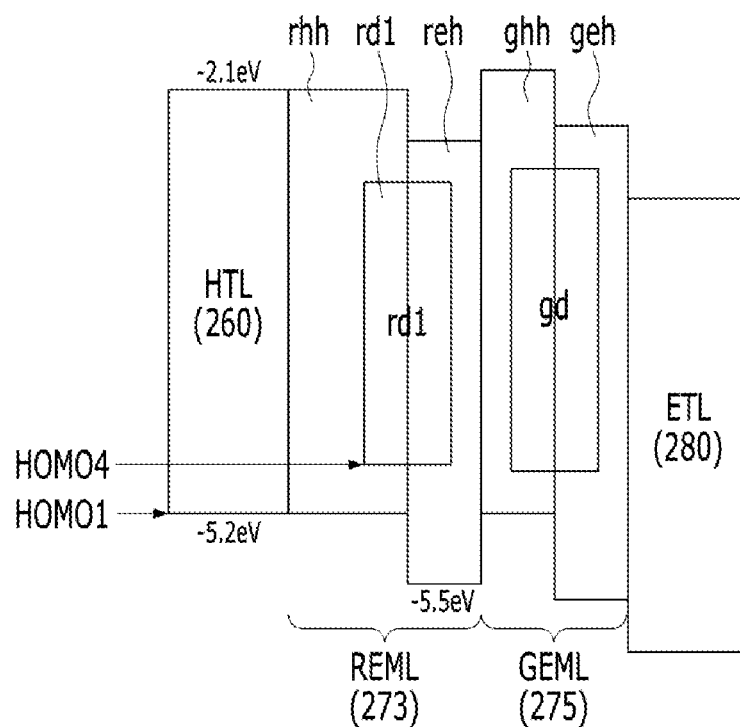
Figure 5:
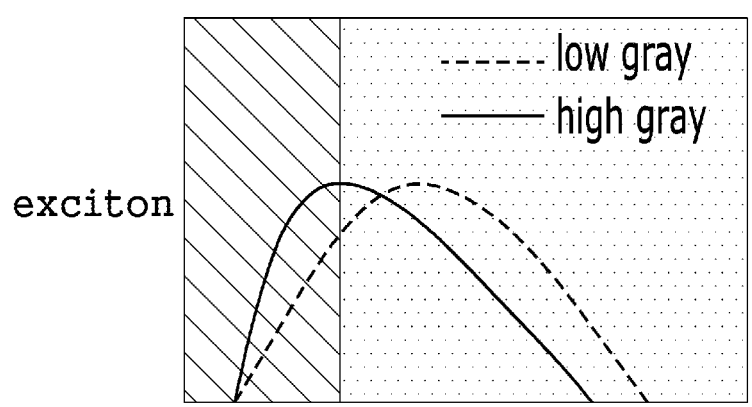
FIG. 5 is a graph showing emission zones occurring at a low grayscale and a high grayscale in the heterogeneous light emitting layer configuration according to the first test example.

FIGS. 4A and 4B are a cross-sectional view illustrating a heterogeneous light emitting layer configuration according to a first test example and an energy band diagram between a hole transport layer and a red light emitting layer therein, respectively. Further, FIG. 5 is a graph showing emission zones occurring at a low grayscale and a high grayscale in the heterogeneous light emitting layer configuration according to the first test example.

In the first test example shown in FIG. 4A, a red light emitting layer 273 and a green light emitting layer 275b respectively included hole transporting hosts rhh and ghh and electron transporting hosts reh and geh. In the red light emitting layer 273, the ratio of the hole transporting host rhh to the electron transporting host reh was 4:6, and the hole transporting host rhh and the electron transporting host reh were doped with a first red dopant rd1 at a concentration of 3.5 wt %. Further, in the green light emitting layer 275b, the ratio of the hole transporting host ghh to the electron transporting host geh was 6:4, and the hole transporting host ghh and the electron transporting host geh were doped with a green dopant gd at a concentration of 15 wt %. Here, the first red dopant rd1 is a triphenylamine compound, as shown in Chemical Formula 1. Among the hole transporting host rhh, the electron transporting host reh and the first red dopant rd1 included in the red light emitting layer 273, the first red dopant rd1 has a HOMO energy level HOMO4 higher than that of a hole transport layer 260 by 0.3 eV or more, as shown in FIG. 4B, and thus, when holes are transferred from the interface between the adjacent hole transport layer 260 and the red light emitting layer 273, the holes introduced into the red light emitting layer 273 are no longer transferred and are trapped in the HOMO energy level HOMO4 of the first red dopant rd1 and are thus stagnant.

[Chemical Formula 1]

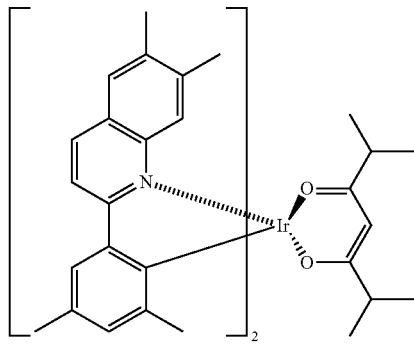

Therefore, a higher driving voltage is required to push the stagnant holes towards the green light emitting layer 275b so as to increase luminous efficacy of the green light emitting layer 275b. Further, in the structure of the first test example, the holes trapped around the HOMO energy level HOMO4 of the first red dopant rd1 are difficult to be combined with electrons and may thus not be used for recombination with excitons, thereby deteriorating luminous efficacy of red light. Since such trapping of some holes is greatly influenced by an electric field density, there is a large difference in trapping of holes according to a difference in densities of current applied at the low grayscale and the high grayscale, thereby causing inversion of color coordinates between the low grayscale and the high grayscale. Therefore, as shown in FIG. 5, excitons in the red light emitting layer 273 and the green light emitting layer 275b are differently distributed at the low grayscale and the high grayscale, and emission zones at the low grayscale and the high grayscale are different. This means that the first test example cannot maintain uniform color coordinates according to a change in current density, and the white organic light emitting element according to the present disclosure aims to solve this problem through various changes in the configuration of different kinds of light emitting layers.

Figure 6A:
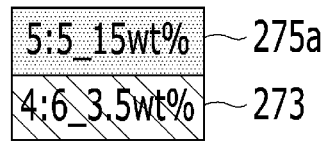
FIGS. 6A to 6C are cross-sectional views illustrating heterogeneous light emitting layer configurations according to second test examples.
Figure 6B:
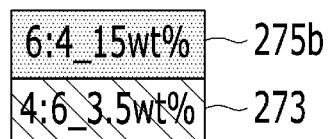
Figure 6C:
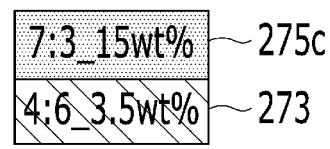
Figure 7:
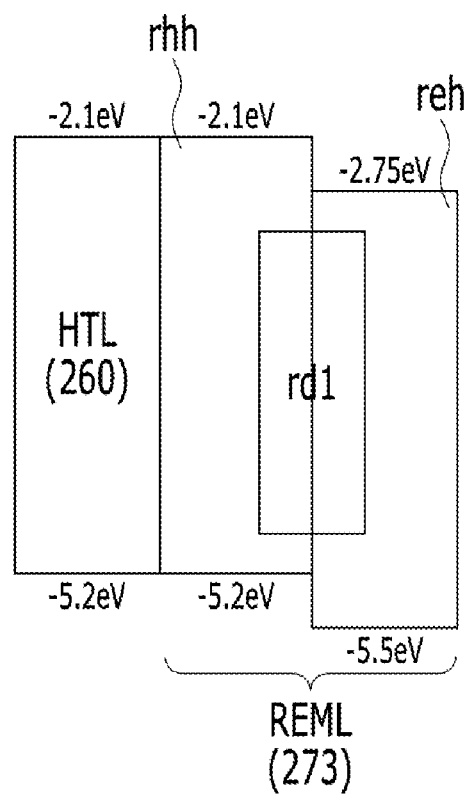
FIG. 7 is an energy band diagram in the second test examples.

FIGS. 6A to 6C are cross-sectional views illustrating a heterogeneous light emitting layer configuration according to second test examples, and FIG. 7 is an energy band diagram of the second test examples.

In the second test examples, a red light emitting layer 273 having the same structure as in the first test example was used, i.e., a ratio of a hole transporting host rhh to an electron transporting host reh was 4:6, and the hole transporting host rhh and the electron transporting host reh were doped with a red dopant rd1 at a concentration of 3.5 wt %, and green light emitting layers 275a, 275b, and 275c in which a ratio of a hole transporting host ghh to an electron transporting host geh was varied (the second test example_A, the second test example_B and the second test example_C) were used. In the second test example_A, the second test example_B, and the second test example_C, the ratio of the hole transporting host ghh to the electron transporting host geh was set to 5:5, 6:4, and 7:3, respectively, and in each of the second test examples, the hole transporting host ghh and the electron transporting host geh were doped with a green dopant gd at a concentration of 15 wt %, in the same manner as in the first test example.

In this case, in all the second test examples (the second test example_A, the second test example_B, and the second test example_C), the red dopant rd1 has a higher HOMO energy level than the HOMO energy level of an adjacent hole transport layer 260, and thus, holes tends to be trapped, similar to the above-described first test example. In the second test examples, a triphenylamine compound having a HOMO energy level of −5.0 eV was used as the red dopant rd1, and an amine-based material having a HOMO energy level of −5.2 eV was used as the adjacent hole transport layer 260.

In order to eliminate a hole-trapping tendency due to a HOMO energy level difference between the hole transport layer and the red dopant rd1 used in in the red light emitting layer in the first and second test examples, the inventors of the present disclosure applied red dopants rd2 and rd3 formed of different materials to the red light emitting layer and observed a change in characteristics.

Figure 8:
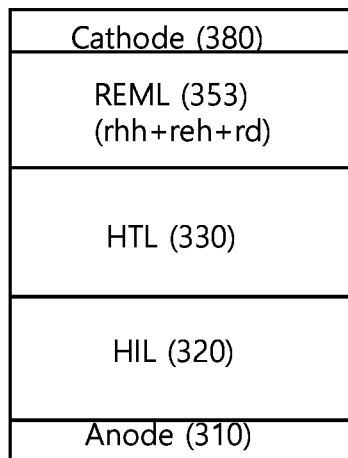
FIG. 8 is a cross-sectional view illustrating an HOD used in third test examples according to an embodiment of the present disclosure.
Figure 9:
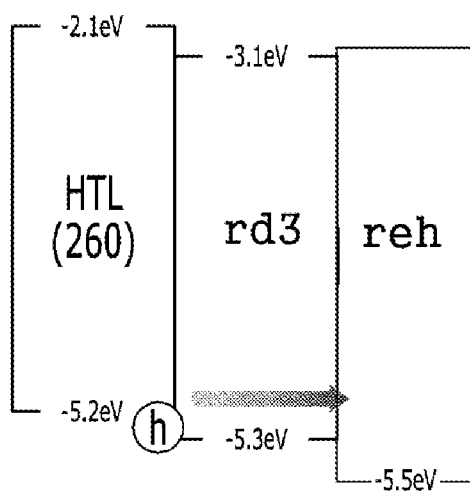
FIG. 9 is an energy band diagram between a hole transport layer and a red light emitting layer in a third test example in which a third red dopant is applied to the red light emitting layer among the third test examples according to an embodiment of the present disclosure.
Figure 10A:
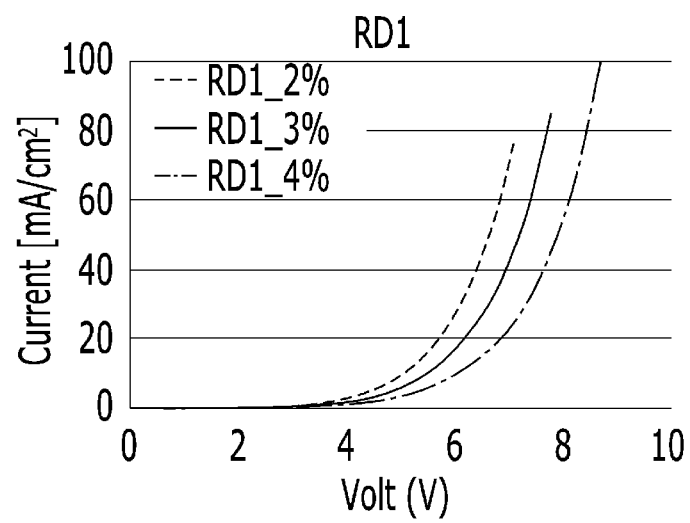
FIGS. 10A to 10C are graphs showing J-V characteristics according to a dopant concentration in the third test examples.
Figure 10B:
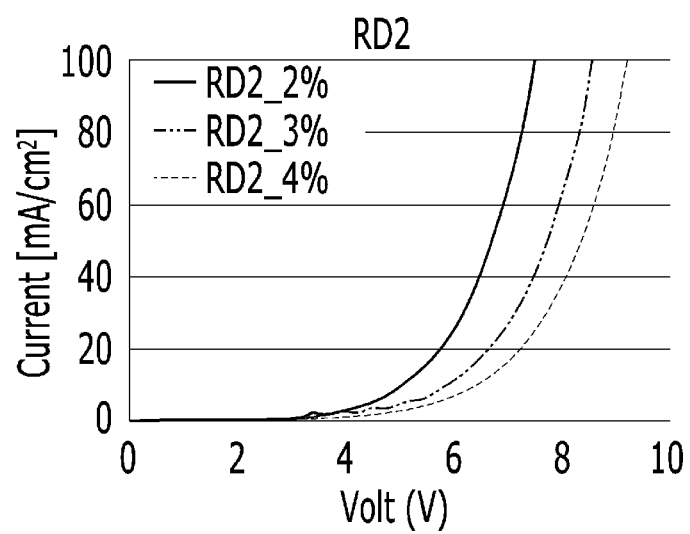
Figure 10C:
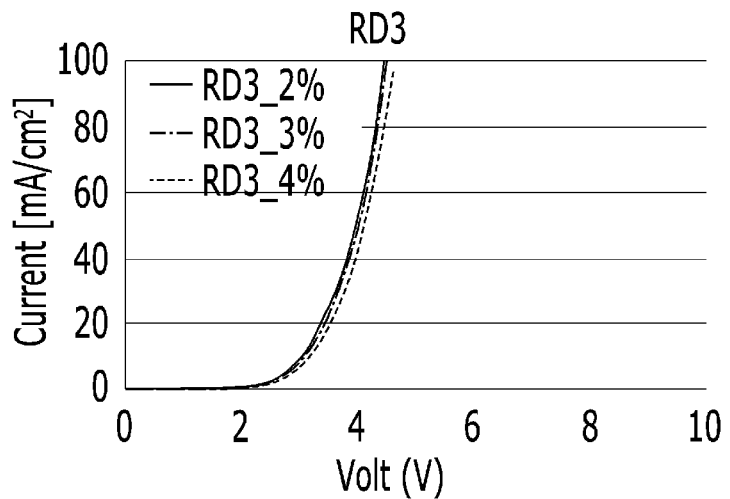

FIG. 8 is a cross-sectional view illustrating a hole-only device (HOD) used in third test examples. FIG. 9 is an energy band diagram between a hole transport layer and a red light emitting layer in a third test example in which a third red dopant is applied to the red light emitting layer among the third test examples. Further, FIGS. 10A to 10C are graphs showing J-V characteristics according to a dopant concentration in the third test examples. In addition, Table shows driving voltage (V) measured by varying a current density to 0.1 mA/cm$^2$, 1 mA/cm$^2$, 5 mA/cm$^2$, 10 mA/cm$^2$, 15 mA/cm$^2$, 20 mA/cm$^2$, 30 mA/cm$^2$, 40 mA/cm$^2$ and 50 mA/cm$^2$, and varying the contents of first to third red dopants in the third test examples (the third test example_A, the third test example_B, and the third test example_C).

In the third test examples, a hole-only device (HOD) shown in FIG. 8 was manufactured so as to observe J-V characteristics (a change in current density in response to driving voltage) according to a change in the red dopant.

As shown in FIG. 8, the HOD is an element in which a first electrode 310 formed of ITO, a hole injection layer 320, a hole transport layer 330, a red light emitting layer 353, and a second electrode 380 formed of Al are stacked such that only a change in transport of holes is observed.

In the third test examples, hole transferring characteristics between the hole transport layer 330 and the red light emitting layer 353 depending on application of current were examined by applying a voltage to the first electrode 310 and the second electrode 380 of the HOD of FIG. 8.

The J-V characteristics were examined, as shown in FIGS. 10A to 10C, under the condition that the red light emitting layer 353 includes a hole transporting host rhh formed of the same material as the hole transport layer 330 and an electron transporting host reh having high electron mobility at a ratio of 4:6, different dopants, i.e., the first to third red dopants rd1, rd2, and rd3, are used, and the amount of each dopant is varied.

The first red dopant rd1 used in FIG. 10A is the compound shown in Chemical Formula 1, and the second red dopant rd2 used in FIG. 10B is a compound which has a different methyl group at a terminal of a triphenylamine monomer combined with iridium, unlike the compound shown in Chemical Formula 1, as shown in Chemical Formula 2, and shows properties almost similar to those of the compound shown in Chemical Formula 1. Therefore, the second red dopant rd2 has a HOMO energy level higher than the HOMO energy level of the hole transport layer 330 adjacent thereto in the phosphorescent light emitting stack, similar to FIG. 7, and thus the second red dopant rd2 has a hole-trapping tendency.

[Chemical Formula 2]

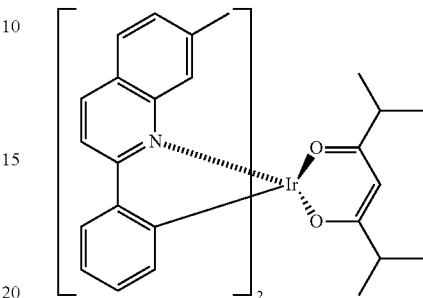

Further, the third red dopant rd3 used in FIG. 10C is a compound of thienopyrimidine and iridium, unlike the triphenylamine monomer and influences the phenyl group affecting the HOMO energy level due to thienopyrimidine functioning as a strong acceptor, and thereby, has a low HOMO energy level. Therefore, holes transferred from the hole transport layer 330 adjacent to the red light emitting layer 353 are not trapped by the third red dopant rd and may pass through the red light emitting layer 353.

[Chemical Formula 3]

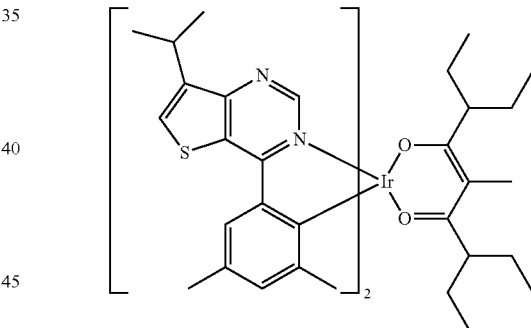

In the first and second red dopants rd1 and rd2 having HOMO energy levels higher than that of the hole transport layer adjacent thereto, as shown in FIGS. 10A and 10B and Table 1, when the content of each dopant is increased to 2 wt %, 3 wt %, and 4 wt %, the hole-trapping tendency becomes severe, and thereby, hole mobility is reduced and a driving voltage (V) at the same current density tends to be gradually increased. Here, the HOMO energy levels of the first and second red dopants rd1 and rd2 are −5.0 eV.

On the other hand, in the third red dopant rd3 having the HOMO energy level of about −5.3 eV, as shown in FIG. 10C and Table 1, even when the content of the third red dopant rd3 is varied to 2 wt %, 3 wt % and 4 wt %, a driving voltage (V) at the same current density tends to be almost uniform. This means that holes are not trapped in a specific area of the red light emitting layer 353 and thus the holes may be transferred normally when the third red dopant rd3 is used, and thus means that the element may be stably driven at a low driving voltage.

TABLE 1

| Current density [mA/cm²] | 3rd test example_A (rd1) [wt %] | | | 3rd test example_B (rd2) [wt %] | | | 3rd test example_C (rd3) [wt %] | | |
| --- | --- | --- | --- | --- | --- | --- | --- | --- | --- |
| | 2 | 3 | 4 | 2 | 3 | 4 | 2 | 3 | 4 |
| 0.1 | 5.4 | 5.5 | 5.7 | 3.2 | 3.5 | 3.5 | 2 | 1.8 | 2 |
| 1 | 6.3 | 6.5 | 6.9 | 4.3 | 4.4 | 4.6 | 2.3 | 2.3 | 2.4 |
| 5 | 7.4 | 7.8 | 8.3 | 5.4 | 5.9 | 6.6 | 2.8 | 2.8 | 2.9 |
| 10 | 7 | 8.4 | 9 | 6 | 6.8 | 7.3 | 3.1 | 3.1 | 3.2 |
| 15 | 8.3 | 8.8 | 9.4 | 6.4 | 7.2 | 7.8 | 3.3 | 3.3 | 3.4 |
| 20 | 8.6 | 9.1 | 9.7 | 6.7 | 7.5 | 8.2 | 3.4 | 3.4 | 3.5 |
| 30 | 9 | 9.5 | 10 | 7.1 | 8 | 8.6 | 3.7 | 3.7 | 3.8 |
| 40 | 9.3 | 9.9 | 10 | 7.4 | 8.3 | 8.6 | 3.8 | 3.9 | 3.9 |
| 50 | 9.5 | 10 | 10 | 7.7 | 8.6 | 8.6 | 4 | 4 | 4.1 |

From Table 1 and FIGS. 10A to 10C, it may be confirmed that, even when the third red dopant rd3 is applied to the red light emitting layer including the hole transporting host and the electron transporting host, the third red dopant rd3 does not restrict mobility of holes supplied from the hole transport layer, and particularly, the content of the third red dopant rd3 in the red light emitting layer does not greatly contribute to an increase in driving voltage.

Figure 11A:
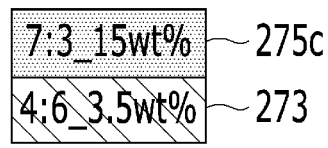
FIGS. 11A to 11C are cross-sectional views illustrating heterogeneous light emitting layer configurations according to fourth test examples according to embodiments of the present disclosure.
Figure 11B:
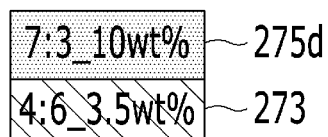
Figure 11C:
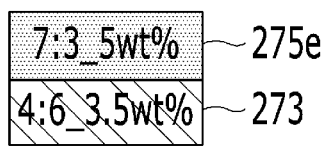
Figure 12A:
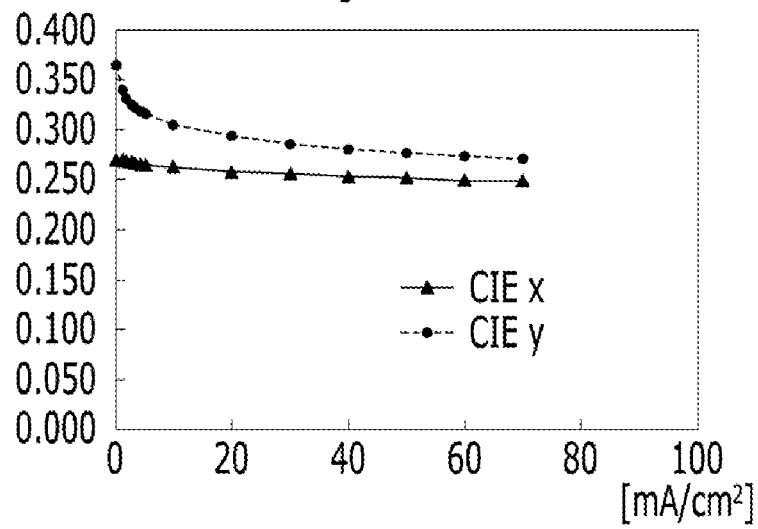
FIGS. 12A to 12C are graphs showing white color coordinate characteristics depending on a change in current density in the fourth test examples.
Figure 12B:
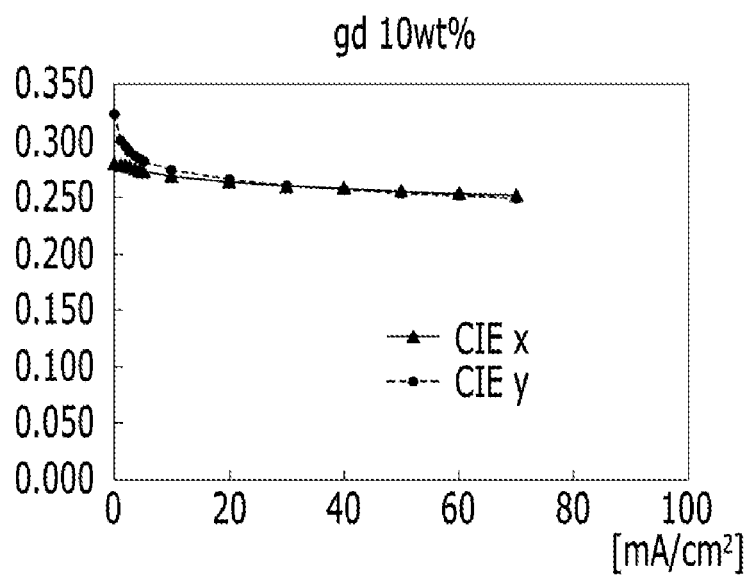
Figure 12C:
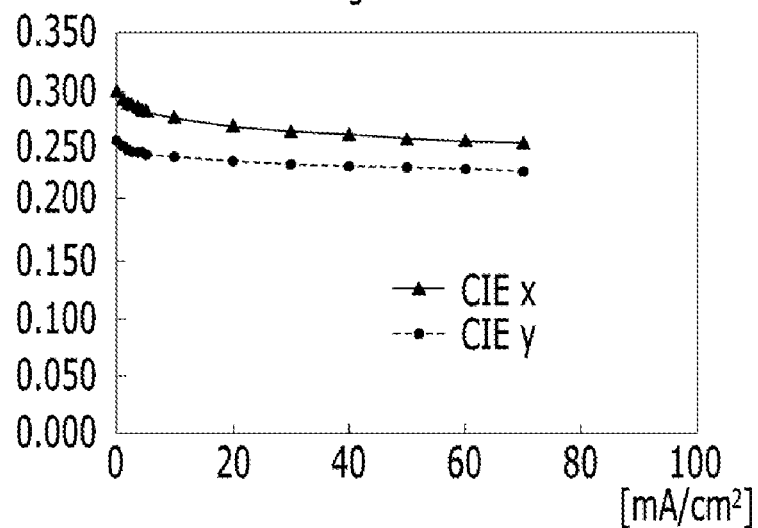
Figure 13A:
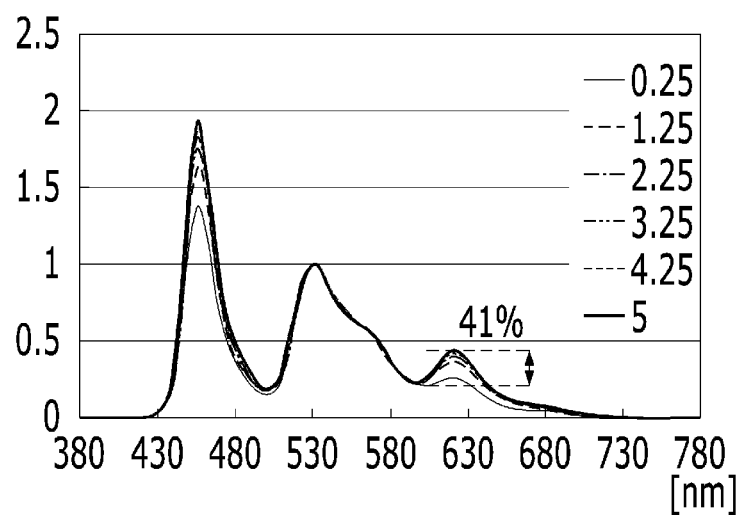
FIGS. 13A to 13C are graphs showing white spectra according to wavelength, depending on the change in the current density in the fourth test examples.
Figure 13B:
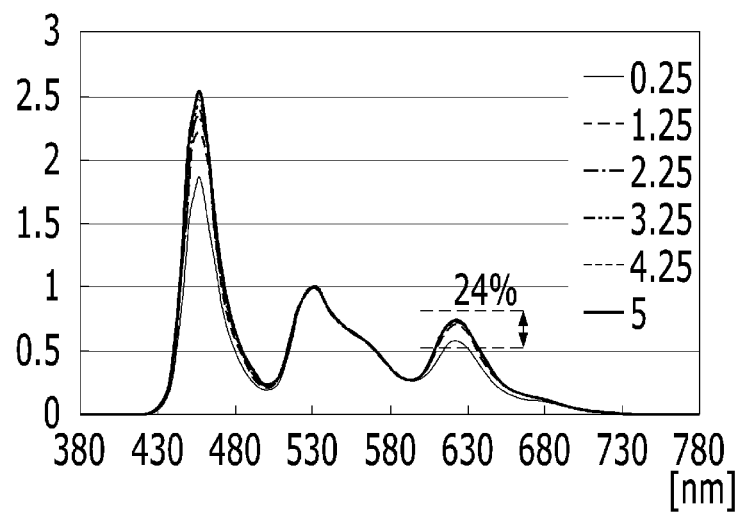
Figure 13C:
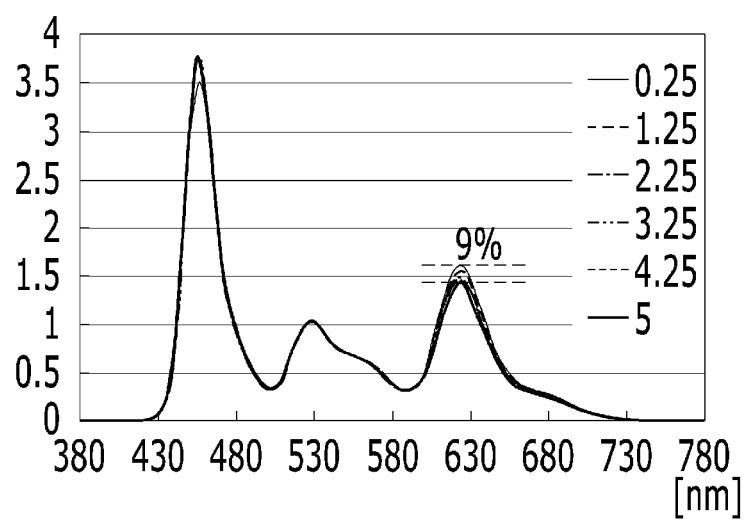

FIGS. 11A to 11C are cross-sectional views illustrating heterogeneous light emitting layer configurations according to fourth test examples, and FIGS. 12A to 12C are graphs showing white color coordinate characteristics depending on a change in current density in the fourth test examples. Further, FIGS. 13A to 13C are graphs showing white spectra according to wavelength, depending on the change in current density in the fourth test examples.

As shown in FIGS. 11A to 11C, a red light emitting layer 273 having the same structure as in the second test examples was used, and exhibits the same energy band diagram characteristics between a hole transport layer 260 and the red light emitting layer 273 as in FIG. 7. That is, in the red light emitting layer 273, the ratio of a hole transporting host rhh to an electron transporting host reh was 4:6, and the hole transporting host rhh and the electron transporting host reh were doped with a red dopant rd1 at a concentration of 3.5 wt %.

Further, in green light emitting layers 275a, 275b and 275c, the ratio of a hole transporting host ghh to an electron transporting host geh was set to 7:3, and the content of a green dopant in each of the green light emitting layers 275a, 275b and 275c was varied to 15 wt %, 10 wt %, and 5 wt %.

In this case, in all the fourth test examples (the fourth test example_A, the fourth test example_B, and the fourth test example_C), the red dopant rd1 has a higher HOMO energy level than the HOMO energy level of an adjacent hole transport layer 260, as shown in FIG. 7, and thus, holes tend to be trapped in the HOMO energy level of the red dopant rd1, similar to the above-described first test example.

Further, in the fourth test example_A, as shown in FIG. 12A, as the current density increases, the CIEy value is greatly changed but the CIEx value is insignificantly changed. This means that the color coordinates of white at a low current density and a high current density are different, and it may be expected that when a display is implemented, a white color will be expressed non-uniformly in different areas. As shown in FIG. 13A, when the white spectrum is observed while increasing the current density in the fourth test example_A, particularly, when an emission peak at red wavelengths is examined, a peak intensity at a current density of 5 mA/cm² is increased by 40% from a peak intensity at an initial current density of 0.25 mA/cm², and thus, it may be confirmed that a change in red light relative to green light greatly influences the color coordinates of white.

Further, in the fourth test example_B, as shown in FIG. 12B, it may be confirmed that the CIEy value and the CIEx value are similarly changed at a current density of 10 mA/cm² of higher, as shown in FIG. 13B, unlike the fourth test example_A.

However, a color coordinate change in the CIEy value becomes great at a low current density of less than 10 mA/cm², and thus, it may be expected that that the color coordinates of white at a low current density and a high current density are different. In this case, as shown in FIG. 13B, when the white spectrum is observed while varying the current density to 0.25 mA/cm², 1.25 mA/cm², 2.25 mA/cm², 3.25 mA/cm², 4.25 mA/cm² and 5 mA/cm² in the fourth test example_B, particularly, when an emission peak at red wavelengths is examined, a peak intensity at a current density of 5 mA/cm² is increased by 24% from a peak intensity at an initial current density of 0.25 mA/cm², and thus, it may be confirmed that a change in red light relative to green light influences the color coordinates of white to a certain extent even if less than in the fourth test example_A.

Further, in the fourth test example_C, as shown in FIG. 11C, it may be confirmed that the CIEy value and the CIEx value are changed similarly at a low current density and a high current density, i.e., at a current density of 10 mA/cm² or higher, as shown in FIG. 12C, unlike the fourth test example_A and the fourth test example_B.

In this case, as shown in FIG. 13C, when the white spectrum is observed while varying the current density to 0.25 mA/cm², 1.25 mA/cm², 2.25 mA/cm², 3.25 mA/cm², 4.25 mA/cm², 5 mA/cm² in the fourth test example_C, particularly, when an emission peak at red wavelengths is examined, a peak intensity at a current density of 5 mA/cm² is increased from a peak intensity at an initial current density of 0.25 mA/cm² by 9%, and thus, it may be confirmed that a change in red light according to a current density is reduced even in the low-current density condition, compared to the fourth test example_A and the fourth test example_B. Thereby, it may be expected that green light and red light are changed similarly even at the low current density and thus more stable white color coordinate characteristics may be acquired.

This means that, under the condition that the same host in the red light emitting layer is doped with the same red dopant, when the content of the green dopant in the green light emitting layer provided on the red light emitting layer is reduced, a change in green light and a change in red light according to a change in the current density in the the color coordinates of white may be relatively reduced.

Further, in the above-described fourth test examples, for example, when the the color coordinates of white of the fourth test example_C, in which a change in red light in the white spectrum according to a change in current density is small, is examined, the color coordinates of white at a current density of about 20 mA/cm are (0.275, 0.245), indicating a reddish tendency, and thus, it may be confirmed that it is difficult to satisfy the color temperature of white required by a display device.

Therefore, test examples, in which uniformity in the color coordinates of white according to a change in current density may be secured and a cool color temperature required by the display device may be expressed, are considered.

Figure 14:
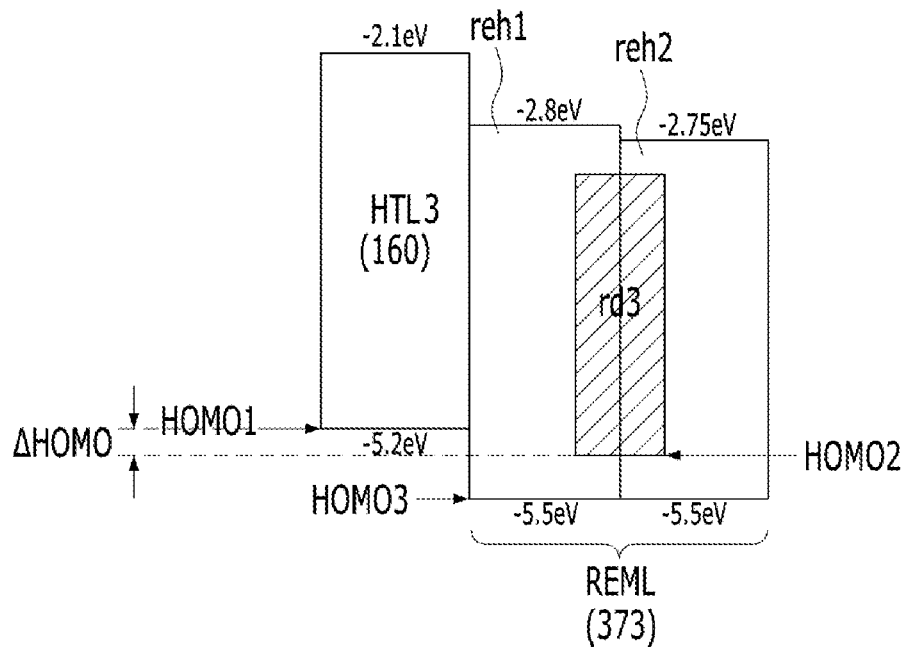
FIG. 14 is an energy band diagram between a hole transport layer and a red light emitting layer in fifth and sixth test examples.
Figure 15A:
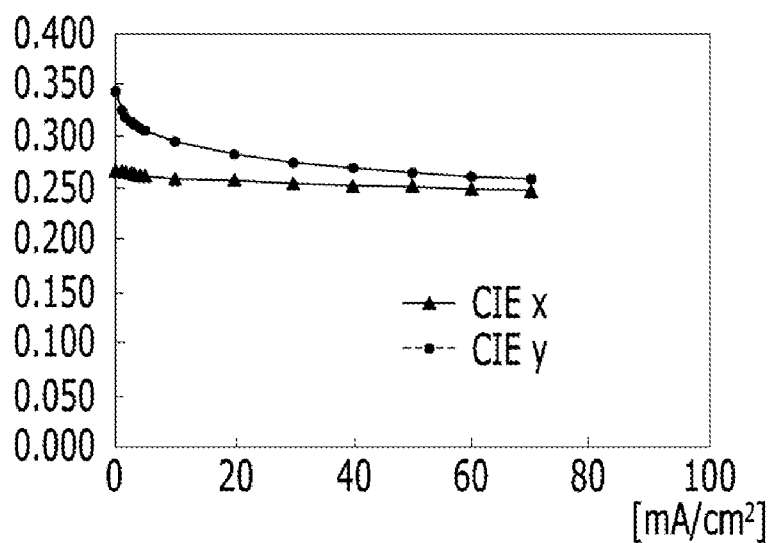
FIGS. 15A to 15F are graphs showing white color coordinate characteristics depending on a change in current density in the fifth test examples (Ex_A, Ex_B, Ex_C, Ex_D, Ex_E and Ex_F).
Figure 15B:
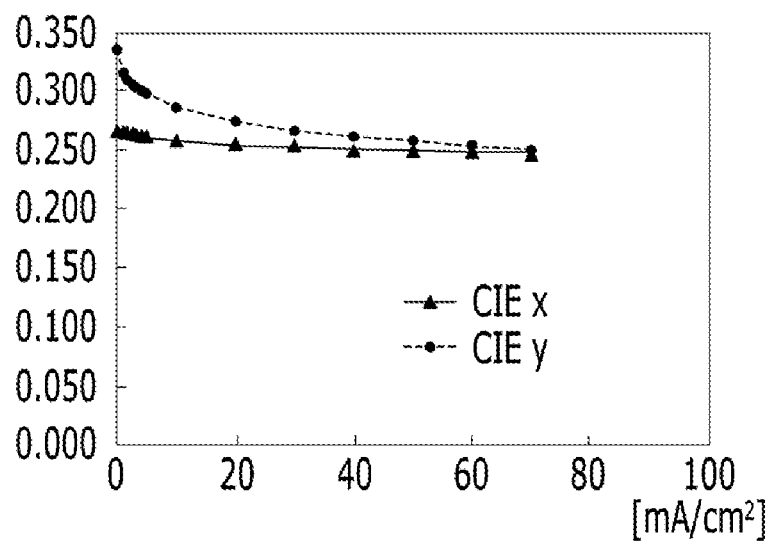
Figure 15C:
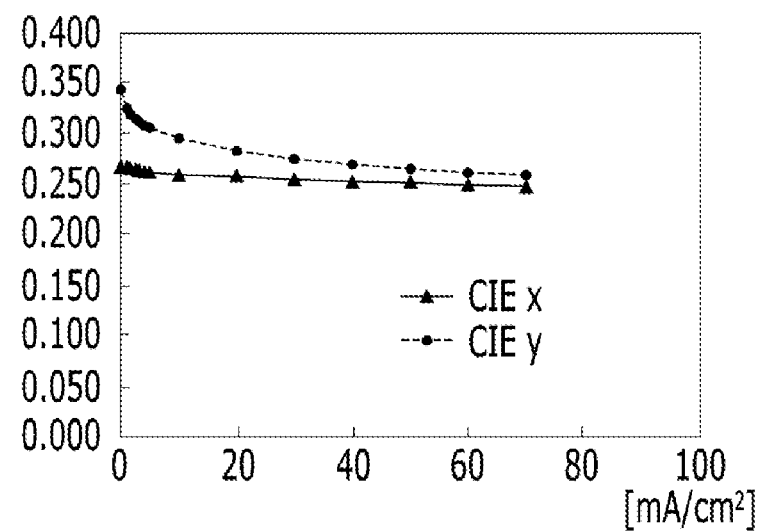
Figure 15D:
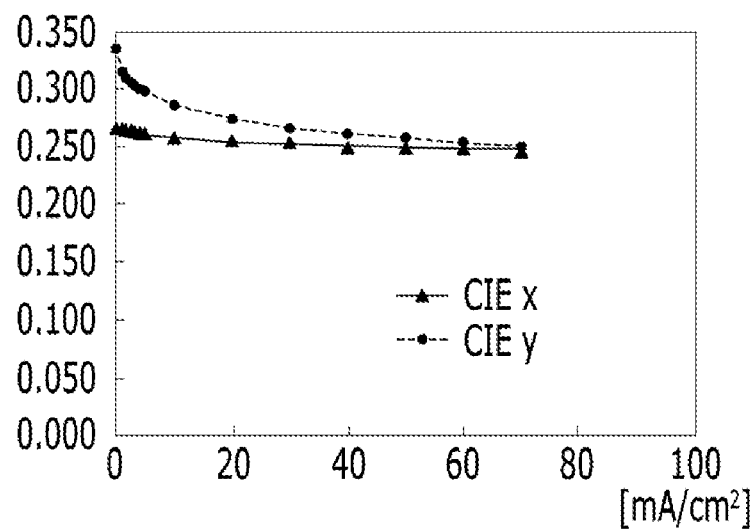
Figure 15E:
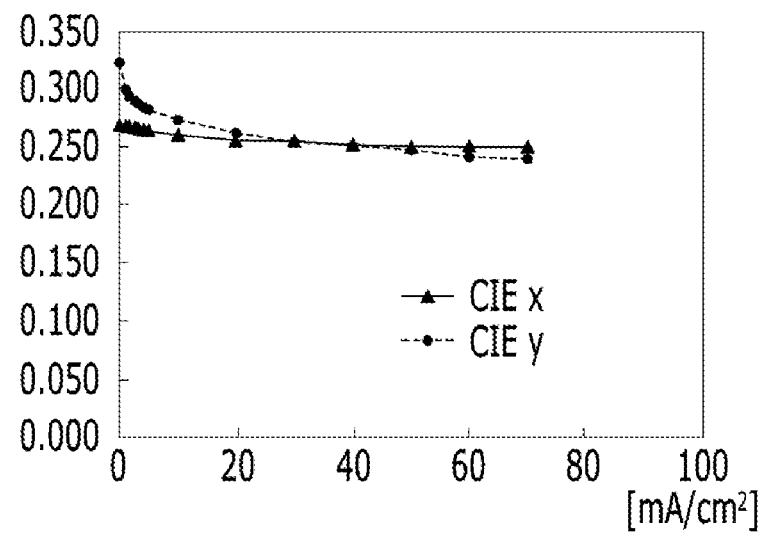
Figure 15F:
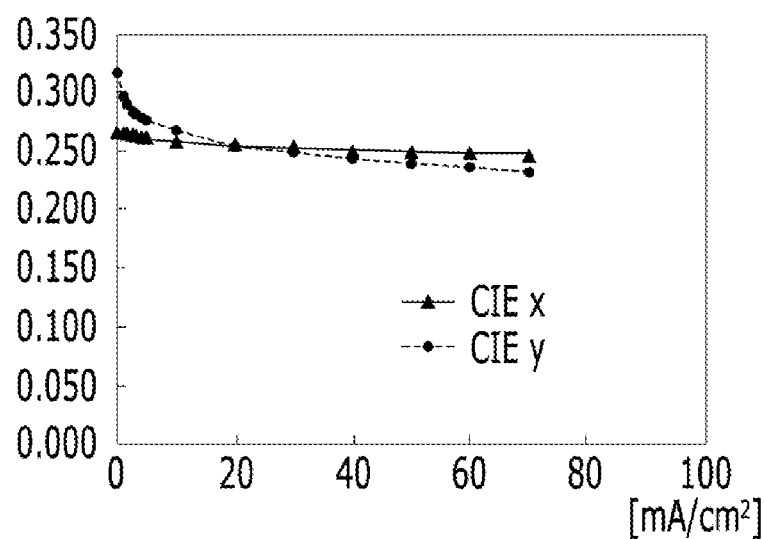

FIG. 14 is an energy band diagram between a hole transport layer and a red light emitting layer in fifth and sixth test examples.

That is, in the fifth and sixth test examples, as shown in FIG. 14, as considered in the white organic light emitting element according to the present disclosure, a red light emitting layer of a phosphorescent light emitting stack uses a third red dopant rd3 having a HOMO energy level lower than or equal to the HOMO energy level of a hole transport layer adjacent to the red light emitting layer so as to obtain a hole trapping prevention effect, and uses only electron transporting hosts reh1 and reh2 so as to concentrate generation of excitons at the interface between the red light emitting layer and a green light emitting layer by adjusting a hole moving speed when holes are transported. That is, in the fifth and sixth test examples, the red light emitting layer 273 is configured such that a mixture of a first-type electron transporting host reh1 and a second-type electron transporting host reh2 is doped with the third red dopant rd3. Here, the HOMO energy levels HOMO3 of the first and second-type electron transporting hosts reh1 and reh2 are lower than the HOMO energy level HOMO2 of the third red dopant rd3, and the LUMO energy levels of the first and second-type electron transporting hosts reh1 and reh2 are lower than the LUMO energy level of the adjacent hole transport layer 160 so as to restrict transfer of electrons to the inside of the red light emitting layer 373. Both the first and second-type electron transporting hosts reh1 and reh2 are compounds having a triazine core, as shown in Chemical Formula 4, i.e., materials having electron mobility higher than hole mobility. The first-type electron transporting host reh1 has electron mobility of $2.3 \times 10^{-6}$ $cm^2V^{-1}s^{-1}$, the second-type electron transporting host reh2 has electron mobility of $1.0 \times 10^{-5}$ $cm^2V^{-1}s^{-1}$, and the electron mobility of the second-type electron transporting host reh2 is five times greater than the electron mobility of the first-type electron transporting host reh1. However, this is only exemplary, electron transporting hosts having different electron mobilities may be used in the red light emitting layer 373. Further, the number of electron transporting hosts used in the red light emitting layer 373 is not limited to two, and a larger number of electron transporting hosts may be included in the red light emitting layer 373. The suggested examples are only examples, and besides triazine core compounds, any other compounds, which have HOMO energy levels lower than the HOMO energy levels of the adjacent hole transport layer 160 and the red dopant rd3 and have electron transporting properties, may be used as hosts.

[Chemical Formula 4]

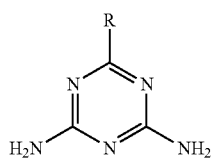

Figure 16:
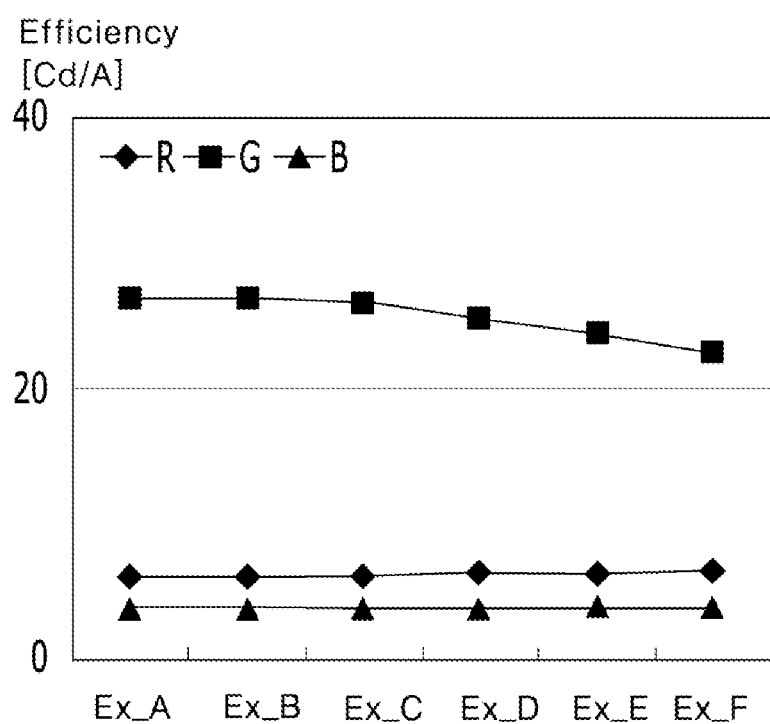
FIG. 16 is a graph showing luminous efficacies of red, green and blue in the fifth test examples.
Figure 17:
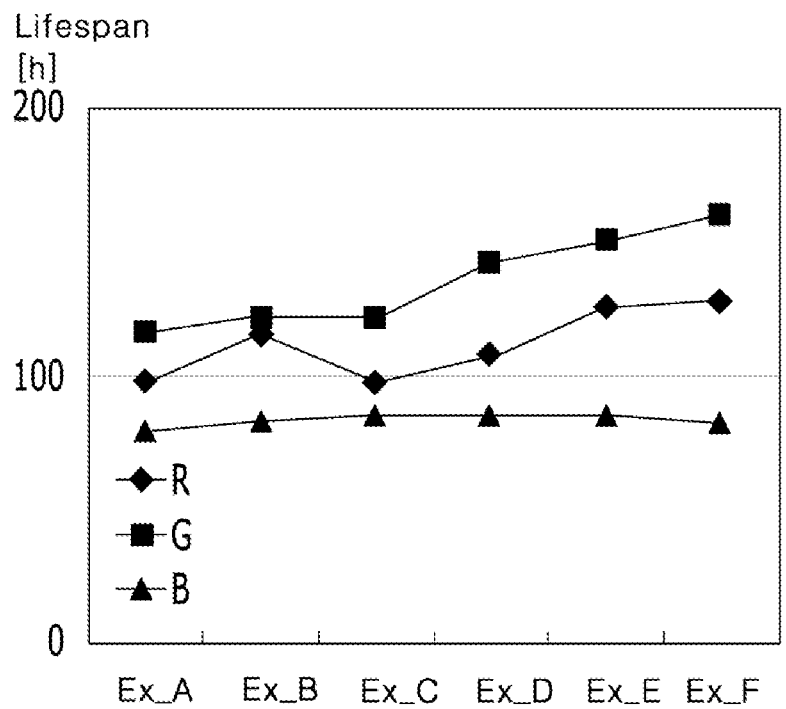
FIG. 17 is a graph showing lifespans of emission of red, green, and blue in the fifth test examples.
Figure 18:
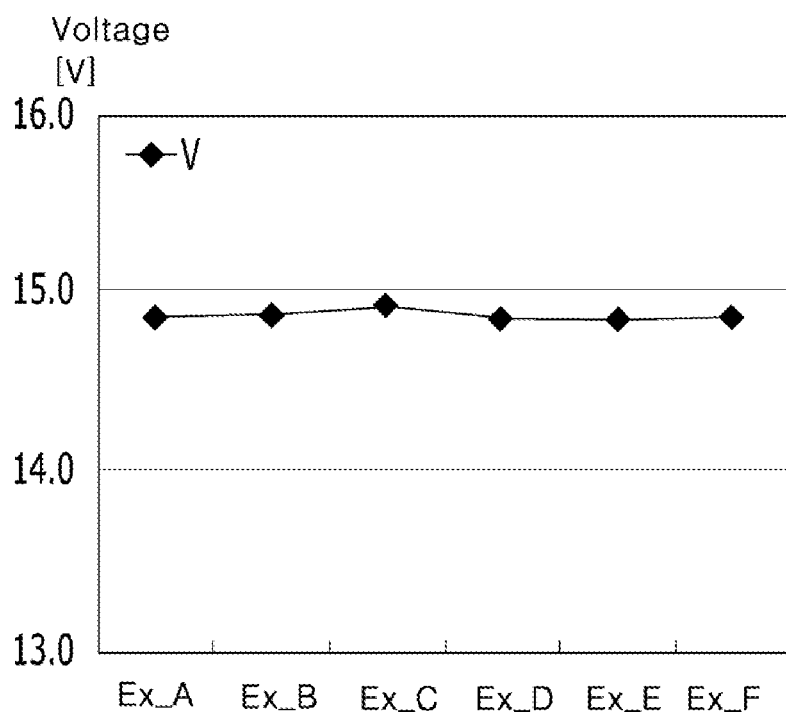
FIG. 18 is a graph showing driving voltages in the fifth test examples.

FIGS. 15A to 15F are graphs showing white color coordinate characteristics depending on a change in current density in the fifth test examples (Ex_A, Ex_B, Ex_C, Ex_D, Ex_E and Ex_F). Further, FIG. 16 is a graph showing luminous efficacies of red, green, and blue in the fifth test examples, and FIG. 17 is a graph showing lifespans of emission of red, green, and blue in the fifth test examples. FIG. 18 is a graph showing driving voltages in the fifth test examples.

FIGS. 15A to 15F illustrate the fifth test examples_A, B, C, D, E, and F, in which the ratio of the first-type electron transporting host reh1 to the second-type electron transporting host reh2 was set to 1:0, 8:2, 6:4, 4:6, 2:8 and 0:1, respectively, in the relationship between the hole transport layer 160 and the red light emitting layer 373 having the energy band diagram shown in FIG. 14.

In the direction from the fifth test example_D to the fifth test example_E and the fifth test example_F, the current density at which a CIEy value and a CIEx value are equal is gradually reduced.

As the content of the first-type electron transporting host reh1 is decreased, the luminous efficacy of green is partially reduced but stability is maintained, as shown in FIG. 16, and thus, the lifespan of emission of green is gradually increased, as shown in FIG. 17. Particularly, the lifespans of both the red light emitting layer and the green light emitting layer, forming the heterogeneous light emitting layer configuration, are improved. Further, as shown in FIG. 18, it may be confirmed that when the red light emitting layer 273 adjacent to the hole transport layer 160 includes only the electron transporting hosts reh1 and reh2, driving voltage is less than 15V (in the same manner in the white organic light emitting element shown in FIG. 1) in all the fifth test examples.

It may be confirmed that, when the red light emitting layer arranged adjacent to the hole transport layer includes only electron transporting hosts and a red dopant having a HOMO energy level lower than that of the hole transport layer in the heterogeneous light emitting layer configuration, all of efficacy, lifespan, driving voltage, and stability may be improved.

Figure 19:
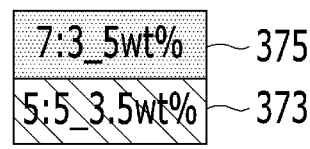
FIG. 19 is a cross-sectional view illustrating a heterogeneous light emitting layer configuration according to the sixth test example.
Figure 20:
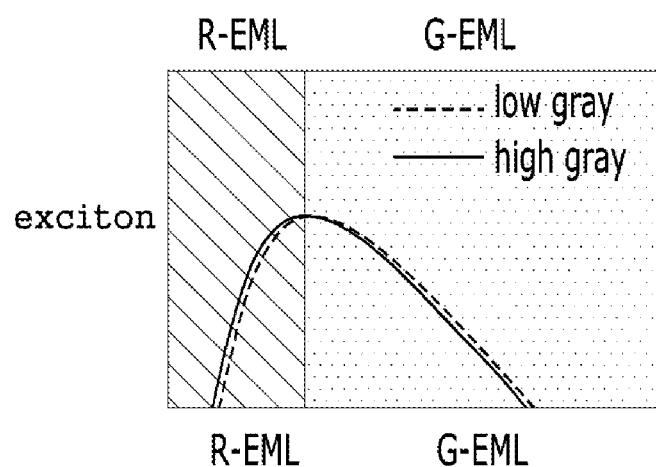
FIG. 20 is a graph showing emission zones occurring at a low grayscale and a high grayscale in the heterogeneous light emitting layer configuration according to the sixth test example.
Figure 21:
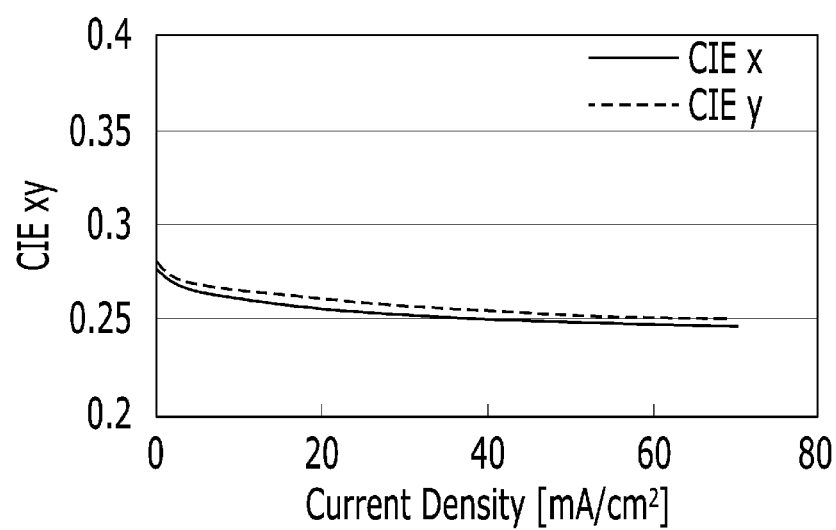
FIG. 21 is a graph showing white color coordinate characteristics depending on a change in current density in the sixth test example.

FIG. 19 is a cross-sectional view illustrating a heterogeneous light emitting layer configuration according to the sixth test example, and FIG. 20 is a graph showing emission zones occurring at a low grayscale and a high grayscale in the heterogeneous light emitting layer configuration according to the sixth test example. FIG. 21 is a graph showing white color coordinate characteristics depending on a change in current density in the sixth test example.

As shown in FIG. 19, considering that in the fifth test examples, when the ratio of the first-type electron transporting host reh1 to the second-type electron transporting host reh2 is 6:4 and 4:6, the CIEx and CIEy values satisfy the cool color coordinates of white and inversion between the CIEx and CIEy is not caused as the current density increases, in the heterogeneous light emitting layer configuration according to the sixth test example, the ratio of the first-type electron transporting host reh1 to the second-type electron transporting host reh2 in a red light emitting layer 373 was set to 5:5, as the optimal configuration.

In this case, as shown in FIG. 11C, the ratio of a hole transporting host ghh to an electron transporting host geh in a green light emitting layer 375 was set to 7:3, and the content of a green dopant in the green light emitting layer 375 was set to 5 wt %.

In this case, in the sixth test example, as shown in FIG. 20, excitons are mainly concentrated at the interface between the red light emitting layer 173 and the green light emitting layer 175, an emission zone occurs at the interface, and the emission zone may be maintained at the center of the red light emitting layer or the green light emitting layer without moving therefrom regardless of a change in the current density, and thus, it may be confirmed that the color coordinates of white are uniformly expressed.

Further, from the graph of FIG. 21 showing the white color coordinate characteristics according to the change in current density in the sixth test example, it may be confirmed that the CIEx and CIEy values are uniformly changed and thus uniform and stable expression of white is facilitated.

Hereinafter, in the above-described first to second test examples and fourth to sixth test examples to which the white organic light emitting element is applied, except for the third test examples to which the HOD is applied, luminous efficacies of red and green, color coordinates, driving voltage, and lifespans of emission of red and green when luminance is reduced to 95% of the luminance at an initial state will be described.

In the first test example, it may be confirmed from Table 2 that luminous efficacy of green is excellent but driving voltage is high, a change in the emission zone at the low grayscale and the high grayscale is great, as shown in FIG. 5, and the great change in the emission zone means a change in the color coordinates of white according to a change in current density and thus causes difficulty stably expressing white.

In the second test examples and the fourth test examples having the same red light emitting layer as in the first test example, the contents of the hosts in each green light emitting layer were varied or the content of the green dopant in each green light emitting layer was varied.

In the second test examples, as the content of the hole transporting host in the green light emitting layer is increased, luminous efficacy of green is raised, but driving voltage is also raised, and thus the lifespan of emission of green light is gradually reduced.

In the fourth test examples, as the content of the green dopant is deceased, the luminous efficacy of red is raised and the lifespan of emission of red light is improved. Particularly, in the fourth test example_C in which the content of the green dopant is 5 wt %, roll-off of green and red light is greatly improved. However, in this case, the color coordinates of white are (0.275, 0.245), indicating a reddish tendency, and thus, it may be confirmed that it is difficult to express cool white.

In the fifth examples, different electron transporting hosts reh1 and reh2 and the third red dopant are used, there is not much change in roll-off in an initial stage, but there is a difference between luminous efficacy of red and luminous efficacy of green and there is a difference between the lifespan of emission of red and the lifespan of emission of green. It may be confirmed that, as the content of the first-type electron transporting host reh1 is decreased, luminous efficacy of green is reduced but the lifespan of emission of green is improved.

The sixth test example, which is the most improved example, and, in which the ratio of the first-type electron transporting host reh1 to the second-type electron transporting host reh2 (reh1:reh2) was set to 1:1 and the first-type and second-type electron transporting hosts reh1 and reh2 were doped with the third red dopant rd3, is applied to the white organic light emitting element of FIG. 1. In this case, it may be confirmed that driving voltage is reduced to 14.9 V which is 94% of the driving voltage in the first test example, the color coordinates (CIEx, CIEy) of white are (0.267, 0.280) and thus more cool white may be expressed, and luminous efficacy of red is relatively improved. Particularly, it may be confirmed that, when the sixth test example is applied, the color coordinates of white are uniform regardless of a change in current density, as shown in FIG. 21.

TABLE 2

| Test example | rd | Efficacy (Cd/A) R | G | CIEx | CIEy | Driving voltage (V) | Lifespan (T95) R | G |
|---|---|---|---|---|---|---|---|---|
| $1^{st}$ example | rd1 | 6.8 | 24.7 | 0.271 | 0.299 | 15.8 | 140 | 210 |
| $2^{nd}$ example A | rd1 | 7.8 | 17.5 | 0.276 | 0.260 | 14.8 | 180 | 200 |
| $2^{nd}$ example B | rd1 | 7.3 | 19.7 | 0.275 | 0.276 | 15.3 | 140 | 200 |
| $2^{nd}$ example C | rd1 | 6.3 | 23.7 | 0.269 | 0.299 | 15.9 | 85 | 160 |
| $3^{rd}$ example A | rd1 | 6.2 | 27.2 | 0.266 | 0.308 | 15.9 | 75 | 100 |
| $3^{rd}$ example B | rd1 | 7.6 | 21.6 | 0.271 | 0.277 | 15.7 | 140 | 210 |
| $3^{rd}$ example C | rd1 | 8.6 | 16.6 | 0.275 | 0.245 | 15.5 | 140 | 260 |
| $5^{th}$ example A | rd3 | 6.1 | 26.5 | 0.268 | 0.308 | 14.9 | 98 | 116 |
| $5^{th}$ example B | rd3 | 6.1 | 26.6 | 0.266 | 0.306 | 14.9 | 116 | 122 |
| $5^{th}$ example C | rd3 | 6.2 | 26.3 | 0.266 | 0.303 | 14.9 | 98 | 122 |
| $5^{th}$ example D | rd3 | 6.4 | 25.0 | 0.267 | 0.297 | 14.8 | 107 | 142 |
| $5^{th}$ example E | rd3 | 6.4 | 24.0 | 0.266 | 0.292 | 14.8 | 126 | 151 |
| $5^{th}$ example F | rd3 | 6.5 | 22.6 | 0.267 | 0.285 | 14.9 | 128 | 160 |
| $6^{th}$ example | rd3 | 7.3 | 22.4 | 0.267 | 0.280 | 14.9 | 123 | 170 |

Hereinafter, an example in which the above-described white organic light emitting element is applied to a display device will be described.

Figure 22:
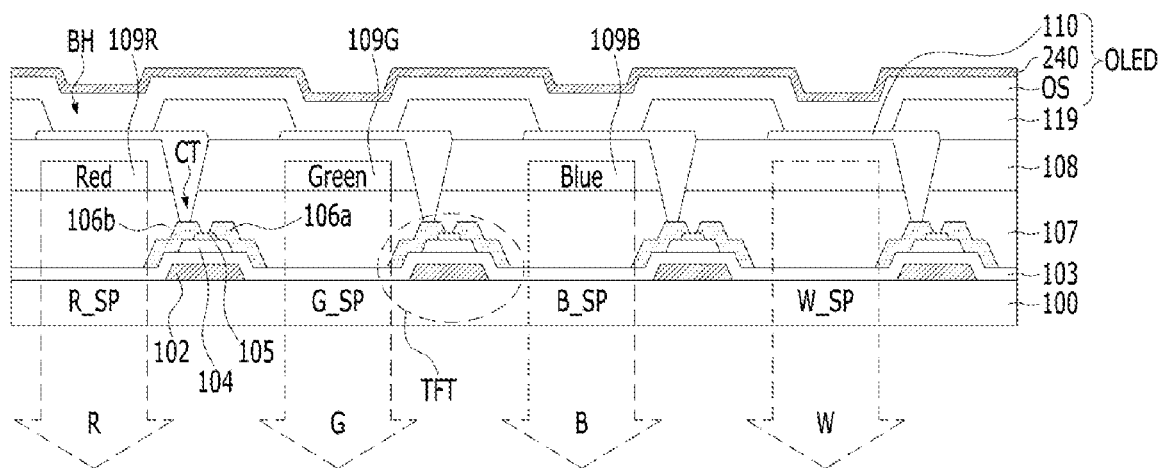
FIG. 22 is a cross-sectional view illustrating a display device including a white organic light emitting element according to an embodiment of the present disclosure.

FIG. 22 is a cross-sectional view illustrating a display device including a white organic light emitting element according to the present disclosure.

As shown in FIG. 22, the display device according to the present disclosure may include a substrate 100 having a plurality of subpixels R_SP, G_SP, B_SP, and W_SP, the white organic light emitting element OLED shown in FIG. 1 which is provided in common in the subpixels R_SP, G_SP, B_SP, and W_SP of the substrate 100, a thin film transistor TFT provided in each of the subpixels R_SP, G_SP, B_SP, and W_SP and connected to the first electrode 110 of the white organic light emitting element OLED, and a color filter layer 109R, 109G, and 109B which is provided under the first electrode 110 of at least one of the subpixels R_SP, G_SP, B_SP, and W_SP.

Although this example illustrates that the display device includes the white subpixel W_SP, the disclosure is not limited thereto, and the display device may have a structure including only the red, green, and blue subpixels R_SP, G_SP, and B_SP without the white subpixel W_SP. As circumstances require, a combination of a cyan subpixel, a magenta subpixel, and a yellow subpixel, which are combined to express white, may be used as a substitute for the red, green and blue subpixels R_SP, G_SP, and B_SP.

The thin film transistor TFT includes, for example, a gate electrode 102, a semiconductor layer 104, and a source electrode 106a and a drain electrode 106b connected to both sides of the semiconductor layer 104.

A gate insulating film 103 is provided between the gate electrode 102 and the semiconductor layer 104.

The semiconductor layer 104 may be formed of, for example, amorphous silicon, polycrystalline silicon, an oxide semiconductor, or a combination of two or more thereof. For example, if the semiconductor layer 104 is formed of an oxide semiconductor, an edge stopper 105 directly contacting the upper surface of the semiconductor layer 104 may be further provided so as to prevent damage to a channel region of the semiconductor layer 104.

Further, the drain electrode 106b of the thin film transistor TFT may be connected to the first electrode 110 by a contact hole CT formed through first and second protective films 107 and 108.

The first protective film 107 is provided so as to primarily protect the thin film transistor TFT, and color filters 109R, 109G, and 19B may be provided on the upper surface of the first protective film 107.

When the subpixels include the red subpixel R_SP, the green subpixel G_SP, the blue subpixel B_SP, and the white subpixel W_SP, first and third color filters 109R, 109G and 109B divided from the color filter layer are provided in the remaining subpixels R_SP, G_SP, and B_SP, except for the white subpixel W_SP, and transmit respective wavelengths of white light emitted via the first electrode 110. Further, the second protective film 108 is provided on the lower surface of the first electrode 110 so as to cover the first to third color filters 109R, 109G, and 109B. The first electrode 110 is formed on the surface of the second protective film 108 except for the contact holes CT.

Here, the white organic light emitting element OLED may include the first electrode 110 which is a transparent electrode, the second electrode 120 which is a reflective electrode arranged opposite the first electrode 110, and a two-stack structure including a blue light emitting stack S1 and a long-wavelength (R/G or YG) (phosphorescent) light emitting stack S2, or a three-stack structure including the first blue light emitting stack BS1, the phosphorescent light emitting stack RGS and the second blue light emitting stack BS2, as shown in FIGS. 1, 3A, and 3B. Otherwise, at least one of the above-described blue light emitting stack or phosphorescent light emitting stack may be provided in plural as an organic stack OS, and a charge generation layer may be provided between the respective light emitting stacks. In this case, the plurality of light emitting stacks may have the same structure.

Here, reference numeral 119 which is not described indicates banks, and BH between the banks 119 indicates bank holes. Light is emitted through an open area in the bank hole BH, and the bank hole BH defines an emission area of each subpixel.

For example, the display device shown in FIG. 22 may be a bottom emission-type display device.

However, the display device according to the present disclosure is not limited thereto, and may be implemented as a top emission-type display device by locating the color filter layer on the upper surface of the second electrode 240, forming the first electrode 110 of a reflective metal and forming the second electrode 110 of a transparent metal or a transflective metal in the structure of the display device shown in FIG. 22.

Otherwise, a transparent organic light emitting element may be implemented by providing or omitting the color filter layer and embodying the first and second electrodes 110 and 240 as transparent electrodes.

In the white organic light emitting element and the display device using the same according to the present disclosure, the phosphorescent light emitting stack including different kinds of light emitting layers contacting each other is changed so as to compensate for different mobility tendencies of holes and electrons in response to an electric field change. If the white organic light emitting element is driven under the condition that higher dependency of electrons than dependency of holes on an electric field change is not compensated for, an emission zone is reversed according to a current density, and consequently, a uniform white spectrum or uniform color coordinates according to the current density may not be acquired, thus causing a panel defect. In the present disclosure, in order to compensate for this, the red dopant included in the red light emitting layer has a HOMO energy level lower than the HOMO energy level of the hole transport layer adjacent to the red light emitting layer so that holes are not trapped in a specific area in the red light emitting layer, thus maintaining a consistent emission zone at the interface between the red light emitting layer and the green light emitting layer of the heterogeneous light emitting layer configuration. Therefore, carriers are not trapped by the red dopant in the area of the red light emitting layer adjacent to the hole transport layer, and the carriers may be smoothly transported to the interface between the red light emitting layer and the green light layer.

Further, since electron transporting hosts are used as hosts included in the red light emitting layer, a change in the transfer rate of carriers, such as holes and electrons, in the red light emitting layer is effectively reduced, and thus, the emission zone may be uniformly maintained regardless of a change in current density.

Therefore, the emission zone may be maintained without change at the interface between the red light emitting layer and the green light emitting layer, and thus, uniformity in the color coordinates of white may be ensured despite the change in current density.

A white organic light emitting element according to one embodiment of the present disclosure may include a first electrode and a second electrode arranged opposite each other, and at least one blue light emitting stack and a phosphorescent light emitting stack, provided between the first electrode and the second electrode and separated from each other by a charge generation layer, the phosphorescent light emitting stack may include a hole transport layer, a red light emitting layer, a green light emitting layer, and an electron transport layer, and the red light emitting layer may include a red dopant having a HOMO energy level lower than or equal to a HOMO energy level of the hole transport layer, and a red host.

The red host may include an electron transport host. Also, in some cases, the red host may exclusively include electron transporting hosts.

The electron transporting hosts may be compounds having a triazine core.

The electron transporting hosts in the red light emitting layer may include a first-type host and a second-type host having different electron mobilities, and HOMO energy levels of the first-type host and the second-type host may be lower than the HOMO energy level of the red dopant.

The red dopant may be a compound of thienopyrimidine and iridium.

A content of the red dopant in the red light emitting layer may be 1 wt % to 10 wt %, and a content of a green dopant in the green light emitting layer may be 3 wt % to 10 wt %.

The red light emitting layer and the green light emitting may contact each other, the green light emitting layer may include a hole transporting host, an electron transporting host and the green dopant, and a content of the hole transporting host in the green light emitting layer may be higher than a content of the electron transporting host in the green light emitting layer.

Any one of the electron transporting hosts in the red light emitting layer may be equal to the electron transporting host in the green light emitting layer.

The at least one blue light emitting stack may be provided in plural between the first electrode and the second electrode.

Each of the blue light emitting stacks may be provided on or under the phosphorescent light emitting stack, or be provided adjacent to the first electrode or the second electrode with the charge generation layer interposed between each of the blue light emitting layers and the phosphorescent light emitting layer.

The red light emitting layer may have an emission peak at wavelengths of 600 nm to 640 nm, and the green light emitting layer may have an emission peak at wavelengths of 500 nm to 540 nm.

Otherwise, the red light emitting layer may have an emission peak at wavelengths of 600 nm to 640 nm, and the green light emitting layer may have an emission peak at wavelengths of 540 nm to 580 nm.

A display device according to the present disclosure so as to achieve the same objects may include a substrate including a thin film transistor provided in each of a plurality of subpixels, a first electrode connected to the thin film transistor in each subpixel, and a second electrode spaced apart from the first electrode and provided throughout the subpixels, and at least one blue light emitting stack and a phosphorescent light emitting stack, provided between the first electrode and the second electrode and separated from each other by a charge generation layer, the phosphorescent light emitting stack may include a hole transport layer, a red light emitting layer, a green light emitting layer and an electron transport layer, and the red light emitting layer may include a red dopant having a HOMO energy level lower than or equal to a HOMO energy level of the hole transport layer, and red hosts.

The red hosts may include electron transporting hosts.

The display device may further include color filters separated by the subpixels and provided under the first electrodes or on the second electrode so as to transmit light having passed through the first electrodes or the second electrode to produce different colored light between adjacent subpixels.

As is apparent from the above description, a white organic light emitting element and a display device using the same according to the present disclosure have the following effects.

In a phosphorescent light emitting stack including different kinds of light emitting layers, a red light emitting layer contacting a hole transport layer includes a red dopant having a HOMO energy level lower than or equal to the HOMO energy level of the hole transport layer, thereby preventing carriers from being trapped by the red dopant in the area of the red light emitting layer adjacent to the hole transport layer and thus allowing the carriers to be smoothly transported to the interface between the red light emitting layer and a green light layer.

Further, because electron transporting hosts are used as hosts included in the red light emitting layer in addition to the red dopant, a change in the transfer rate of the carriers, such as holes and electrons, in the red light emitting layer is effectively reduced, and thus, an emission zone may be uniformly maintained regardless of a change in current density Therefore, the emission zone may be maintained without change at the interface between the red light emitting layer and the green light emitting layer, and thus, uniformity in the color coordinates of white may be ensured despite the change in current density.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A white organic light emitting element comprising:
   a first electrode and a second electrode opposite each other; and
   at least one blue light emitting stack and a phosphorescent light emitting stack provided between the first electrode and the second electrode and separated from each other by a charge generation layer,
   wherein the phosphorescent light emitting stack comprises a hole transport layer, a red light emitting layer for emitting a single red color on the hole transport layer, a green light emitting layer on the red light emitting layer, and an electron transport layer on the green light emitting layer,
   wherein the red light emitting layer comprises a red dopant and red hosts,
   wherein the hole transport layer is positioned between the charge generation layer and the red light emitting layer, and
   wherein the red dopant has a highest occupied molecular orbital (HOMO) energy level lower than a HOMO energy level of the hole transport layer, and higher than a HOMO energy level of the red hosts.

2. The white organic light emitting element according to claim 1, wherein the red hosts comprise electron transporting hosts.

3. The white organic light emitting element according to claim 2, wherein the electron transporting hosts are compounds having a triazine core.

4. The white organic light emitting element according to claim 2, wherein the electron transporting hosts in the red light emitting layer comprise a first-type host and a second-type host having different electron mobilities,
   wherein HOMO energy levels of the first-type host and the second-type host are lower than the HOMO energy level of the red dopant.

5. The white organic light emitting element according to claim 1, wherein the red dopant is a compound of thienopyrimidine and iridium.

6. The white organic light emitting element according to claim 2, wherein:
   a content of the red dopant in the red light emitting layer is 1 wt % to 10 wt %; and
   a content of a green dopant in the green light emitting layer is 3 wt % to 10 wt %.

7. The white organic light emitting element according to claim 6, wherein a content of the electron transporting hosts in the red light emitting layer is 90 wt % to 99 wt %.

8. The white organic light emitting element according to claim 6, wherein:
   the red light emitting layer and the green light emitting layer contact each other;
   the green light emitting layer comprises a hole transporting host, an electron transporting host, and the green dopant;
   a total content of the hole transporting host and the electron transporting host in the green light emitting layer is 90 wt % to 97 wt %; and
   a content of the hole transporting host in the green light emitting layer is higher than a content of the electron transporting host in the green light emitting layer.

9. The white organic light emitting element according to claim 8, wherein a content of any one of the electron transporting hosts in the red light emitting layer is equal to a content of the electron transporting host in the green light emitting layer.

10. The white organic light emitting element according to claim 1, wherein the at least one blue light emitting stack is provided between the first electrode and the second electrode.

11. The white organic light emitting element according to claim 10, wherein each of the at least one blue light emitting stacks are provided on or under the phosphorescent light emitting stack, or is provided adjacent to the first electrode or the second electrode with the charge generation layer interposed between each of the at least one blue light emitting layer and the phosphorescent light emitting layer.

12. The white organic light emitting element according to claim 1, wherein:
the red light emitting layer has an emission peak at wavelengths of 600 nm to 640 nm; and
the green light emitting layer has an emission peak at wavelengths of 500 nm to 540 nm.

13. The white organic light emitting element according to claim 1, wherein:
the red light emitting layer has an emission peak at wavelengths of 600 nm to 640 nm; and
the green light emitting layer has an emission peak at wavelengths of 540 nm to 580 nm.

14. A display device comprising:
a substrate comprising a thin film transistor provided in each of a plurality of subpixels;
a first electrode connected to the thin film transistor in each subpixel, and a second electrode spaced apart from the first electrode and provided throughout the plurality of subpixels; and
at least one blue light emitting stack and a phosphorescent light emitting stack, provided between the first electrode and the second electrode and separated from each other by a charge generation layer,
wherein the phosphorescent light emitting stack comprises a hole transport layer, a red light emitting layer for emitting a single red color on the hole transport layer, a green light emitting layer on the red light emitting layer, and an electron transport layer on the green light emitting layer,
wherein the red light emitting layer comprises a red dopant and red hosts,
wherein the hole transport layer is positioned between the charge generation layer and the red light emitting layer, and
wherein the red dopant has a highest occupied molecular orbital (HOMO) energy level lower than a HOMO energy level of the hole transport layer, and higher than a HOMO energy level of the red hosts.

15. The display device according to claim 14, wherein the red hosts comprise electron transporting hosts.

16. The display device according to claim 14, further comprising color filters separated by the plurality of subpixels and provided under the first electrode or on the second electrode so as to transmit light having passed through the first electrode or the second electrode to produce different colored light between adjacent subpixels.

17. The display device according to claim 15, wherein the electron transporting hosts are compounds having a triazine core.

18. The display device according to claim 15, wherein the electron transporting hosts in the red light emitting layer comprise a first-type host and a second-type host having different electron mobilities,
wherein HOMO energy levels of the first-type host and the second-type host are lower than the HOMO energy level of the red dopant.

19. The display device according to claim 14, wherein the red dopant is a compound of thienopyrimidine and iridium.

20. The white organic light emitting element according to claim 1, wherein an energy level difference between the HOMO energy level of the red dopant and the HOMO energy level of the hole transport layer is 0.01 eV to 0.5 eV.

* * * * *